United States Patent
Marutani

(10) Patent No.: US 7,187,217 B2
(45) Date of Patent: Mar. 6, 2007

(54) CLOCK FREQUENCY DIVIDER AND TRIGGER SIGNAL GENERATION CIRCUIT FOR SAME

(75) Inventor: Masazumi Marutani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 55 days.

(21) Appl. No.: 11/060,477

(22) Filed: Feb. 18, 2005

(65) Prior Publication Data

US 2005/0258879 A1    Nov. 24, 2005

(30) Foreign Application Priority Data

May 21, 2004 (JP) ............................. 2004-152161

(51) Int. Cl.
*H03B 19/00* (2006.01)
*H03K 21/00* (2006.01)

(52) U.S. Cl. ....................... 327/117; 327/115

(58) Field of Classification Search .............. 327/115, 327/117; 377/47, 48
See application file for complete search history.

(56) References Cited

U.S. PATENT DOCUMENTS 5,371,414 A * 12/1994 Galbraith .................... 327/525
6,064,247 A * 5/2000 Krakirian .................... 327/295
6,617,893 B1 * 9/2003 Born et al. .................. 327/115
6,882,189 B2 * 4/2005 Tam et al. ................... 327/115
6,958,633 B2 * 10/2005 Chien ......................... 327/115
7,042,257 B2 * 5/2006 Wang ......................... 327/115
2005/0258878 A1 * 11/2005 Neurauter et al. ........... 327/115

FOREIGN PATENT DOCUMENTS

| JP | 53-076731 | 7/1978 |
| JP | 60-086918 | 5/1985 |
| JP | 63-003514 | 1/1988 |
| JP | 05-259895 | 10/1993 |
| JP | 05-347555 | 12/1993 |
| JP | 07-050576 | 2/1995 |

* cited by examiner

*Primary Examiner*—Linh My Nguyen
*Assistant Examiner*—Rey Aranda
(74) *Attorney, Agent, or Firm*—Arent Fox PLLC

(57) ABSTRACT

A clock frequency divider is provided which has first through Pth (where P is an integer) sub-counters, each capable of counting M+1 clock pulses and provided in parallel, and first through Pth clock signals are provided to the sub-counters, which has same period as a reference clock signal and are sequentially shifted by 1/P of the period of the reference clock signal. Of the first through Pth sub-counters, when the Nth sub-counter (where N is an arbitrary number from 1 to P) finishes counting a prescribed number M of reference clock pulses, all the other sub-counters are initialized, or, at least the (N+1)th sub-counter is initialized.

14 Claims, 20 Drawing Sheets

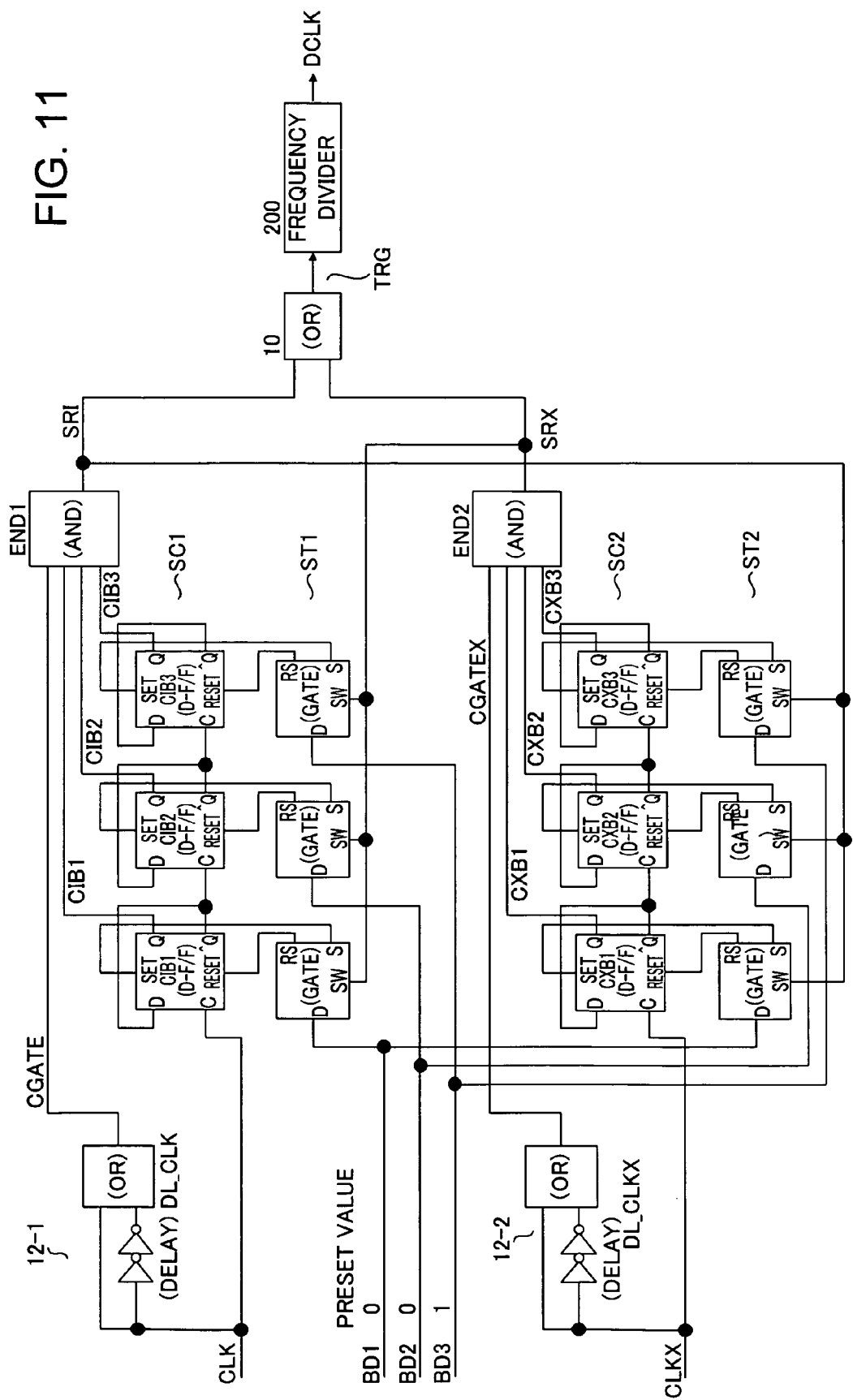

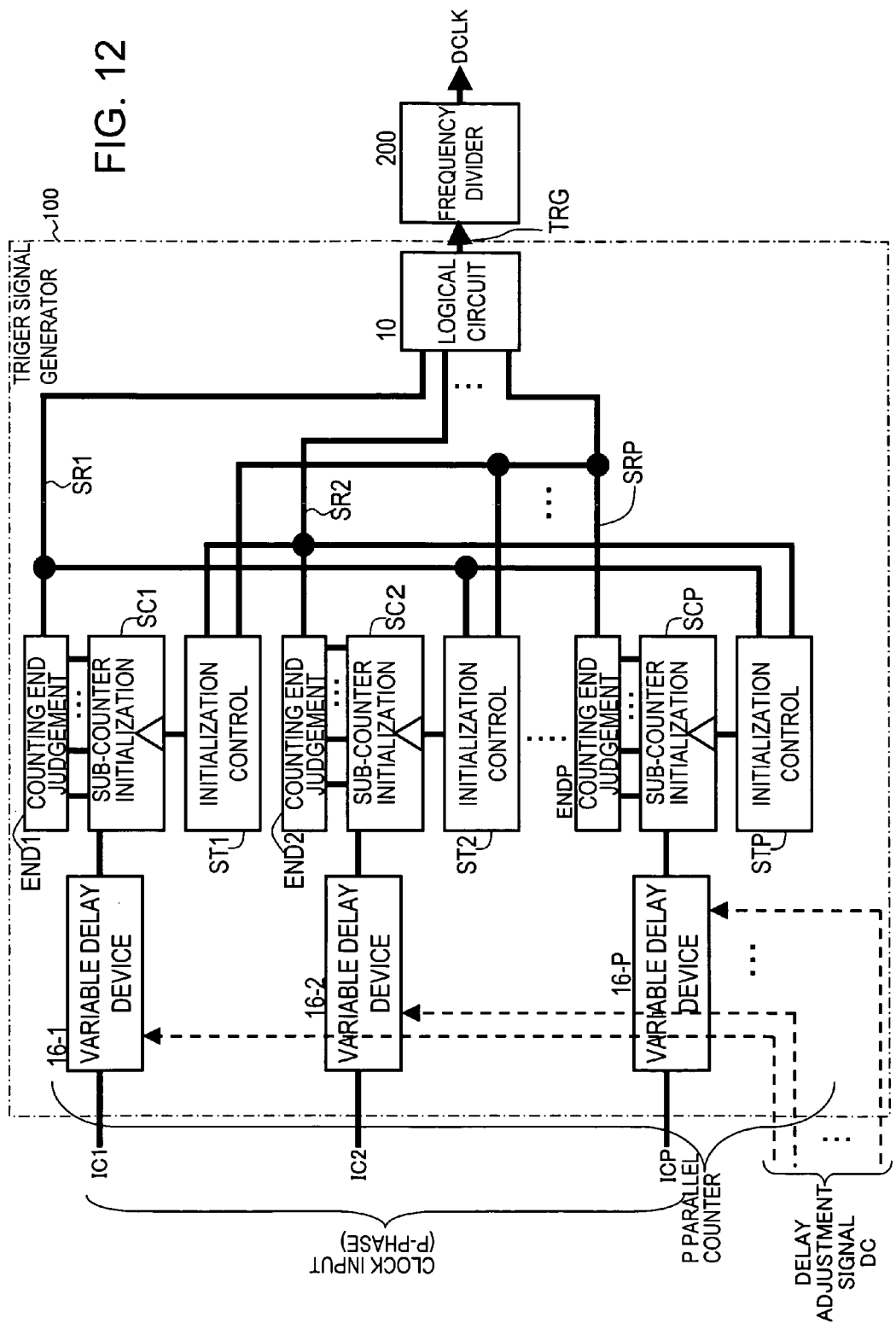

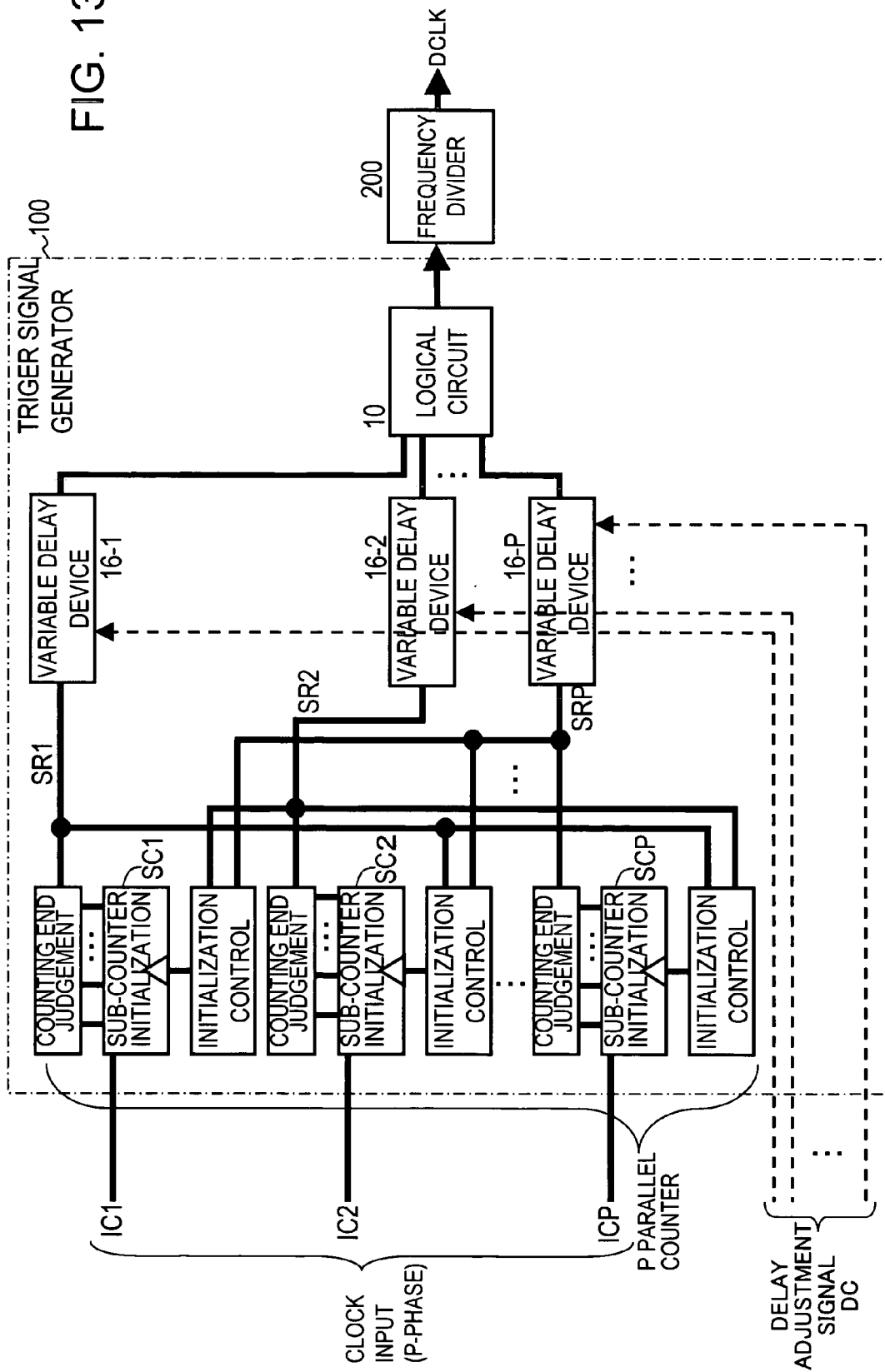

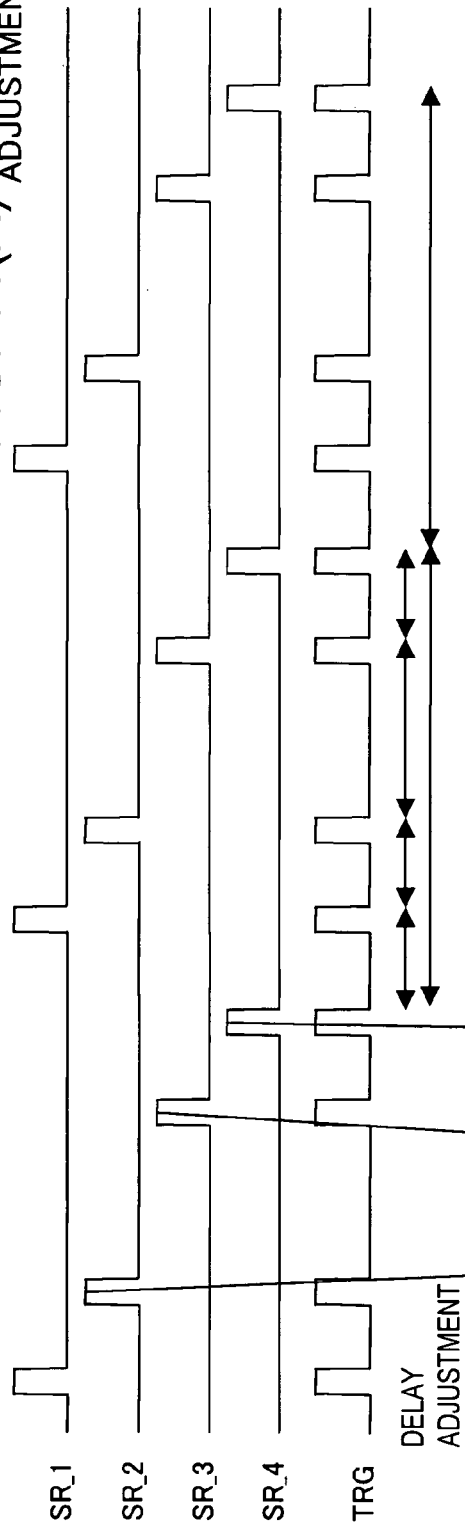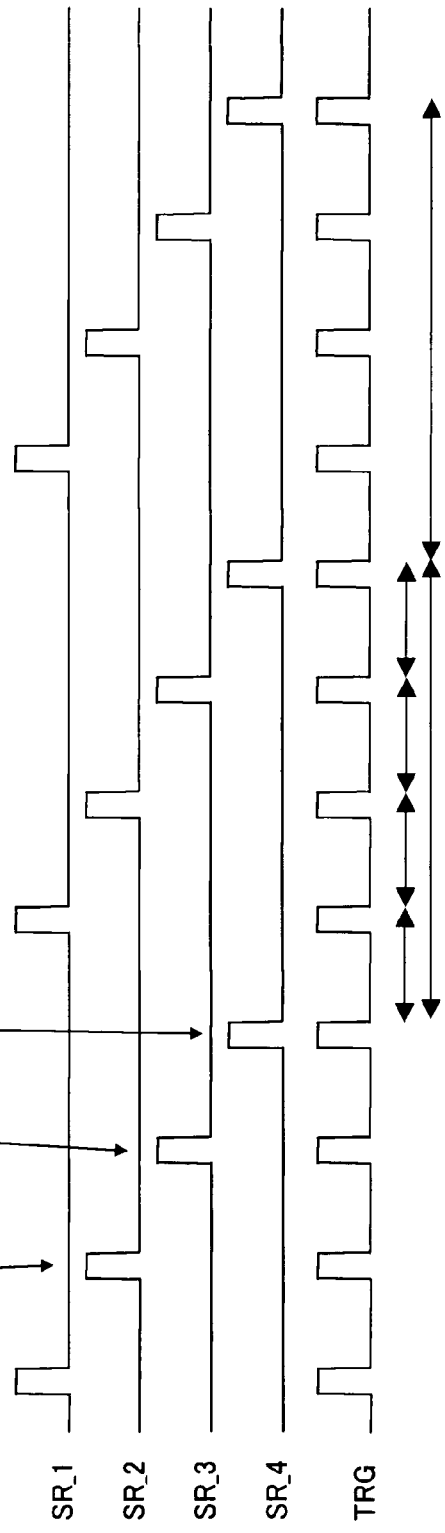

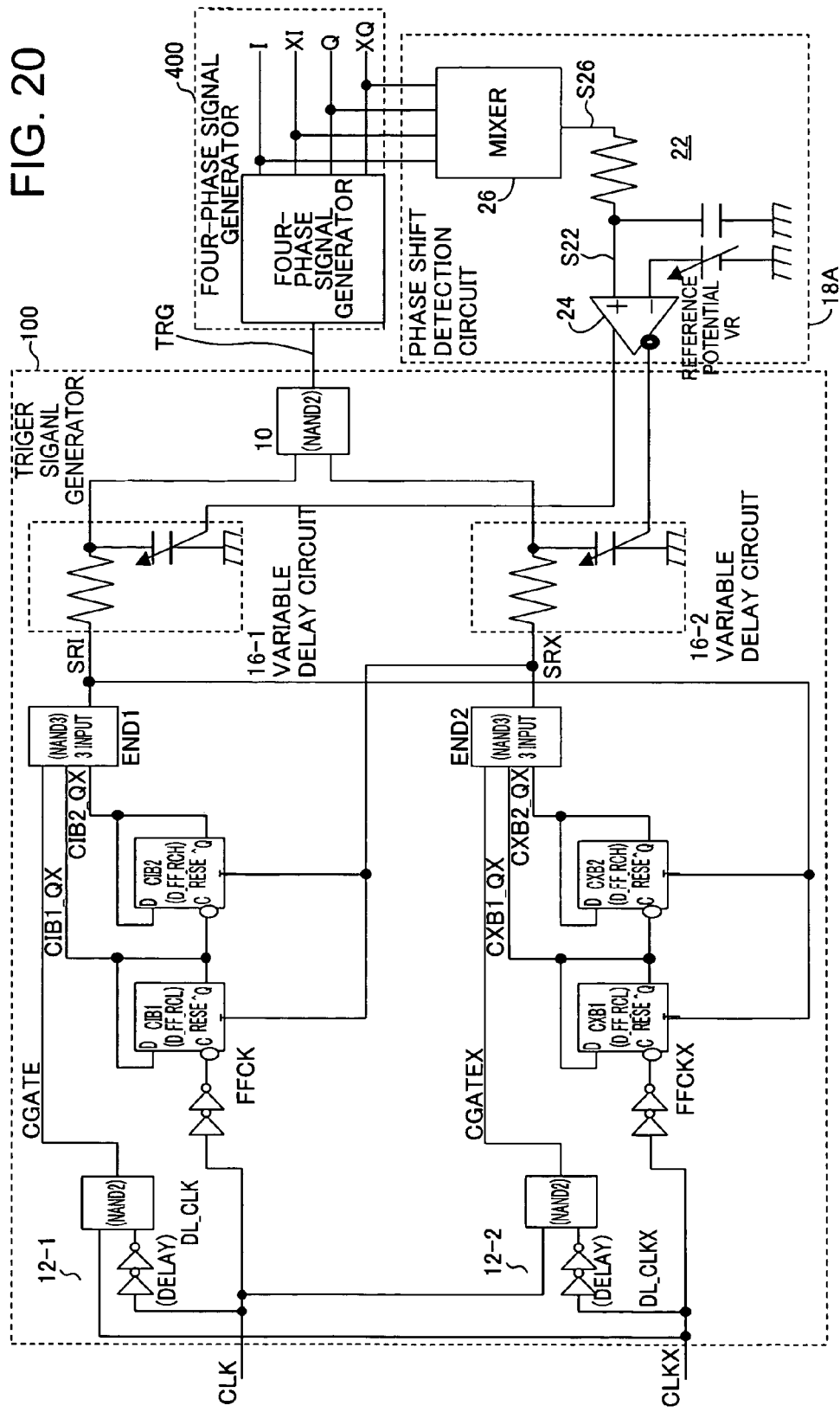

CLOCK FREQUENCY DIVIDER AND TRIGGER SIGNAL GENERATION CIRCUIT FOR SAME

CROSS-REFERENCE TO RELATED APPLICATIONS

This application is based upon and claims the benefit of priority from the prior Japanese Patent Application No. 2004-152161, filed on May 21, 2004, the entire contents of which are incorporated herein by reference.

BACKGROUND OF THE INVENTION

1. Field of the Invention

This invention relates to a clock frequency divider which divides a frequency of a clock by an arbitrary value including an odd number, and a trigger signal generation circuit which supplies the clock frequency divider with a timing signal which fractionally divides the clock signal, and in particular, relates to a clock frequency divider which reduces the number of flip-flop stages and enables high-speed operation, and to a trigger generation circuit for same.

2. Description of the Related Art

A clock frequency divider divides a frequency of a reference clock signal by a prescribed division ratio, and generates a frequency-divided clock signal having a period which is a reference clock period multiplied by a frequency division value. General clock frequency dividers have a ring counter in which flip-flops are connected in a plurality of stages, and outputs the frequency-divided clock signal with a timing resulting by counting a reference clock pulses of the preset frequency division value. As a result of this configuration, the number of flip-flop stages is increased, a time until the output state of the counter circuit is finalized in response to changes in the reference clock signal is long, and high-frequency clock signals cannot be accommodated.

A clock frequency divider of the prior art has been proposed which is configured from two counters capable of counting up to N reference clock pulses, and a switching circuit which selects the outputs thereof, to generate a frequency-divided clock signal with a division ratio of 1/(N+0.5). See for example Japanese Patent Laid-open No. 53-76731.

A clock frequency divider has also been proposed in which a single counter circuit and a ½ frequency divider circuit are connected, and the counter is reset by logical operations on different counter outputs of the counter circuit and on the output of the frequency divider circuit, to generate a frequency-divided clock signal divided by an odd number. See for example Japanese Patent Laid-open No. 60-86918.

Further, a clock frequency divider has been proposed having a first counter which counts reference clock pulses and a second counter which counts inverted clock pulses of the reference clock signal, and which uses both counter outputs to generate a frequency-divided clock signal, frequency-divided by an odd number, with a duty ratio of 50%. See for example Japanese Patent Laid-open No. 63-3514.

Further, a clock frequency divider has been proposed in which two auxiliary counter circuits are provided, and data output terminals of two auxiliary counters are logically combined to generate an output clock signals, while in addition the auxiliary counters are reset by the output clock signal. This clock frequency divider is capable of a comparatively large number of division ratios. See for example Japanese Patent Laid-open No. 7-50576.

Further, a clock frequency divider has been proposed in which a counter which counts to N is used to count up to N, and an output signal is used for reset. See for example Japanese Patent Laid-open No. 5-347555.

Further, a clock frequency divider has been proposed in which two flip-flops are provided, operating on positive-phase and negative-phase clock signals, in the final stage of a counter which counts up to N. See for example Japanese Patent Laid-open No. 5-259895.

Clock frequency dividers proposed in the prior art have an operation speed capable of operating by fast reference clock signals, but cannot generate a frequency-divided clock signal at an arbitrary fractional division ratio by the reference clock signal. For example, when the division ratio is made larger than 2, a counting circuit in which a plurality of flip-flop stages are connected must be used. The counting circuit operates by fast clock signals, and performs counting operation by finalizing output values of a plurality of flip-flop stages. Consequently when the number of stages is large, the time from a change in the reference clock signal until output value finalization is correspondingly longer. Hence the counter circuit with the number of flip-flop stages cannot readily operate by the fast clock signal, and so it is desired that the number of flip-flop stages of the counter circuit be made as small as possible.

On the other hand, there are clock frequency dividers in which the counter circuit with a smaller maximum count value than the division ratio is used to generate a trigger signal, and this trigger signal is modified to generate the frequency-divided clock signal, as for example in Japanese Patent Laid-open No. 60-86918. However, when dividing by an even number in such the clock frequency divider, the trigger signal is generated with the timing at which N pulses of the reference clock signal are counted, and the trigger signal is generated with the timing at which (N+1) pulses are counted, and these trigger signals are used to generate a clock pulse frequency-divided by the odd number of (2N+1). However, a duty ratio of such the frequency-divided clock signal is not 50%. Because the frequency-divided clock signal with the duty ratio of 50% is suitable for various applications, it is desirable that the clock frequency divider generates the frequency-divided clock signal with the duty ratio of 50%.

SUMMARY OF THE INVENTION

Hence an object of this invention is to provide a clock frequency divider capable of operating by fast clock signals, and a trigger signal generation circuit for same.

Another object of this invention is to provide a trigger signal generation circuit which generates a trigger signal with an arbitrary fractional division ratio with respect to a reference clock signal, and a clock frequency divider using same.

Another object of this invention is to provide a clock frequency divider which can generate a frequency-divided clock signal having an arbitrary division ratio with respect to the reference clock signal with a duty ratio of 50%, and a trigger signal generation circuit for same.

In order to attain the above objects, according to one perspective of the invention, a clock frequency divider is provided which has first through Pth (where P is an integer) sub-counters, each capable of counting M+1 clock pulses and provided in parallel, and first through Pth clock signals are provided to the sub-counters, which has same period as a reference clock signal and are sequentially shifted by 1/P of the period of the reference clock signal. Of the first through Pth sub-counters, when the Nth sub-counter (where N is an arbitrary number from 1 to P) finishes counting a prescribed number M of reference clock pulses, all the other sub-counters are initialized, or, at least the (N+1)th sub-counter is initialized. After this initialization, the (N+1)th sub-counter counts M pulses of the clock signal inputted the (N+1)th sub-counter, lagging in phase by 1/P of the clock period of the clock signal inputted the Nth sub-counter, and when the (N+1)th sub-counter have counted M pulses, initializes the next sub-counter. In this way, each sub-counter counts M pulses of the clock signal with phase lagging the reference clock signal by 1/P each and then initializes the next stage, and by repeating this operation the P sub-counters can generate a trigger signal of the reference clock signal frequency-divided by (M+1/P). This trigger signal has a period equal to (M+1/P) that of the reference clock signal, so that by using this trigger signal to generate a frequency-divided clock signal, a frequency-divided clock signal, with frequency divided by an arbitrary odd number with a duty ratio of 50%, can be generated. Further, a four-phase clock signal, with phases shifted by 90°, can be generated.

BRIEF DESCRIPTION OF THE DRAWINGS

FIG. 11 is a specific circuit diagram of a clock frequency divider of the third embodiment;

FIG. 12 shows the configuration of a clock frequency divider in a fourth embodiment;

FIG. 13 shows the configuration of a clock frequency divider of the fourth embodiment;

FIG. 14 is a diagram of the operation waveforms of the clock frequency dividers of FIG. 12 and FIG. 13;

FIG. 20 shows an example of application of the trigger signal generation circuit in a sixth embodiment.

DESCRIPTION OF THE PREFERRED EMBODIMENTS

Figure 1:
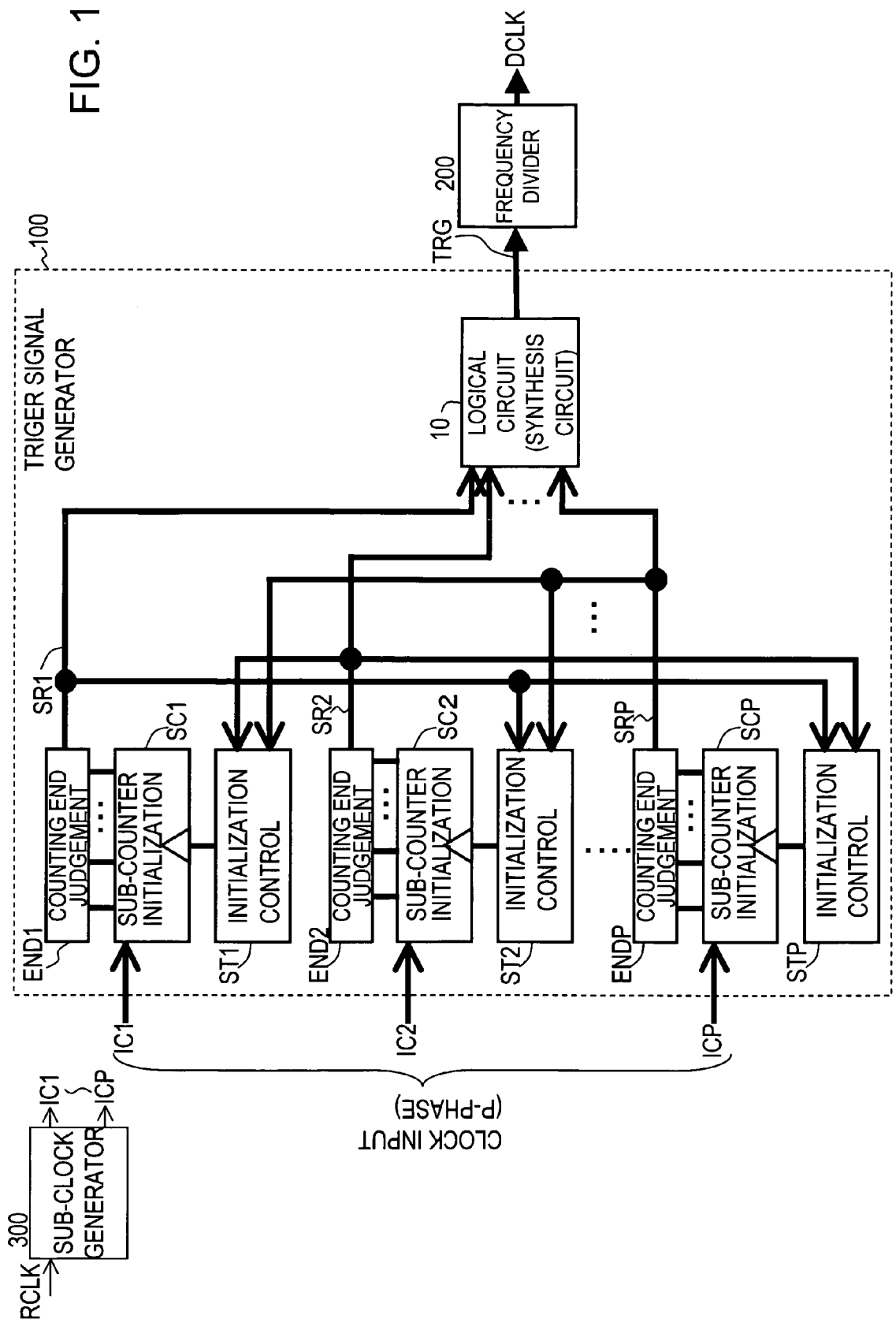
FIG. 1 shows the configuration of a clock frequency divider in a first embodiment.

Below, embodiments of the invention are explained referring to the drawings. However, the technical scope of the invention is not limited to these embodiments, but extends to the inventions described in the scope of claims and to inventions equivalent thereto.

FIG. 1 shows the configuration of a clock frequency divider in a first embodiment. This clock frequency divider has a sub-clock generator 300 which, based on a reference clock signal RCLK, generates P sub-clock signals IC1 to ICP, sequentially phase-shifted to lag by 1/P of the reference clock period; a trigger signal generator 100 which generates a trigger signal TRG which frequency-divides the reference clock signal by (M+1/P); and a frequency divider 200 which generates a frequency-divided clock signal DCLK divided by a prescribed division ratio based on the trigger signal TRG.

The trigger signal generator 100 has P sub-counters SC1 to SCP provided in parallel; the sub-counters respectively have a counting-end judgment circuit END1 to ENDP which judge the end of counting by the sub-counter and generate sub-counter output signals SR1 to SRP, and an initialization control circuit ST1 to STP which sets the initialization value of its own sub-counter in response to the sub-counter output signals SR1 to SRP from another sub-counter. The trigger generation circuit 100 has a synthesis circuit 10 which performs logic synthesis of the sub-counter output signals SR1 to SRP and outputs the trigger signal TRG. If for example the sub-counter output signals SR1 to SRP are H-level clock signals, this synthesis circuit 10 is a logical OR circuit.

A summary of the operation of this clock frequency divider is as follows. Each of the sub-counters SC1 to SCP begins counting the pulses of the respective sub-clock IC1 to ICP from the initial state up to a prescribed number of counts M, and then the corresponding counting-end judgment circuit END1 to ENDP outputs a sub-counter output signal SR1 to SRP. The sub-counter output signals SR1 to SRP are supplied to the initialization control circuits ST1 to STP of other sub-counters, so that the corresponding sub-counter is set to an initial value in response to one of the sub-counter output signals SR1 to SRP. For example, if the initial value is "0", counting ends when the count value becomes M. Or, if the initial value is "N", counting ends when the count value becomes N+M. In this way, by freely setting initial values and ending values, each time the arbitrary number M is counted the sub-counter outputs the respective output signal SR1 to SRP.

Furthermore, the sub-clock signals IC1 to ICP counted by the sub-counters have phases each delayed by 1/P of the period of the reference clock signal RCLK. Hence when all the sub-counters are reset to their initial values with arbitrary timing, thereafter each sub-counter starts counting the sub-clock signal with a phase lag of 1/P each. Hence if for example the Nth sub-counter (where N is a number from 1 to P) finishes counting and outputs the sub-counter output signal SRN, in response to this sub-counter output signal SRN, all the sub-counters other than this sub-counter SCN, or at least the next-stage sub-counter SCN+1, are reset to the initial value. Then, the (N+1)th sub-counter first counts the sub-clock signal which first rises before the other sub-clock signals, in advance of the other sub-counters. In succession to this, the (N+2)th, (N+3)th and other sub-counters begin counting the corresponding sub-clock signals. In this way, the (N+1)th sub-counter first finishes counting to the prescribed value M in advance of the other sub-counters, and outputs the sub-counter output SRN+1.

That is, the first through Pth sub-counters SC1 through SCP generate, in order, sub-counter output signals SR1 to SRP at intervals of (M+1/P) times the period of the reference clock signal RCLK. By synthesizing these sub-counter output signals SR1 to SRP in a synthesis circuit 10, the trigger signal TRG can be generated which is the reference clock signal RCLK frequency-divided by (M+1/P). Moreover, because the M count time is common to the sub-counters, the period of the trigger signal TRG is fixed. That is, if M=3 and P=2, the period of the trigger signal TRG is 3.5 times the reference clock signal period (division ratio 1/3.5), and the frequency divider 200, by frequency-dividing this by 2, can generate the frequency-divided clock signal DCLK which frequency-divides the reference clock signal by 7. Or, if M=3 and P=4, the period of the trigger signal TRG is 3.25 times that of the reference clock signal (division ratio 1/3.25), and by frequency-dividing this by 4, the frequency divider 200 can generate the frequency-divided clock signal DCLK which frequency-divides the reference clock signal by 13. That is, the frequency-divided clock signal can be generated which, by frequency dividing by P the trigger signal TRG, can frequency-divide the reference clock signal by the arbitrary number.

Thus by arbitrarily selecting the sub-counter number P and the count value M of the sub-counters, the frequency-divided clock signal can be generated with the arbitrary odd-numbered division ratio. Moreover, the count value M of the sub-counters can be made small, so that each sub-counters can perform by using fast clock signals. Further, the trigger signal TRG has a fixed period, so that the duty ratio of the frequency-divided clock signal generated therefrom can easily be made 50%. Below, a clock frequency divider in a specific circuit is explained.

Figure 2:
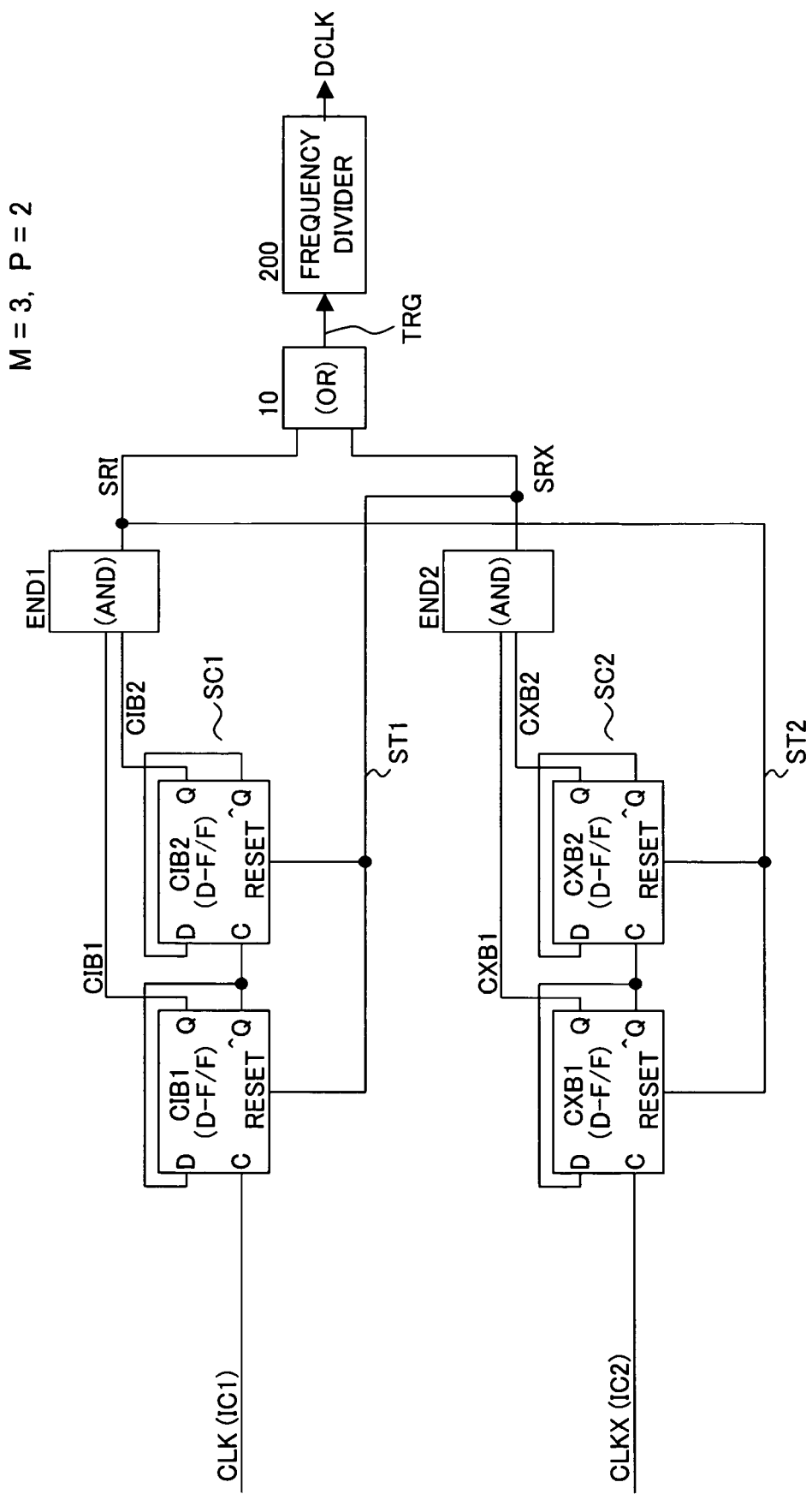
FIG. 2 is a specific circuit diagram of a clock frequency divider in the first embodiment.

FIG. 2 is a specific circuit diagram of the clock frequency divider in the first embodiment. In this example, M=3 and P=2. In this example, 2-bit counters are used, so that the sub-counters can count up to M+1, that is, 4, if the counting-end value is 3. Because the maximum count value is M=3, each of the sub-counters SC1 and SC2 comprises two flip-flops CIB1, CIB2, CXB1, CXB2, and the sub-counters respectively count the sub-clock signals IC1 (CLK) and IC2 (CLKX), phase-shifted by ½ (P=2) of the period of the reference clock signal. Each of the flip-flops latches the data at data input terminal D in response to the rising edge at the clock terminal, and outputs a non-inverted signal and an inverted signal of the data D latched at the output terminals Q and ^Q. The inverted output ^Q is fed back to the data input terminal D.

The signals outputted from the output terminals Q of the flip-flops comprised by the sub-counters SC1, SC2 are supplied to the counting-end judgment circuits END1, END2. These counting-end judgment circuits END1, END2 comprise AND circuits, and upon detecting that the outputs of the flip-flops are all "1", output the sub-counter output signals SRI, SRX. These sub-counter output signals SR1, SR2 are supplied to the reset terminals of the flip-flops of the other sub-counter, to initialize the other sub-counter to the initial value "0". That is, in this example the initialization control circuit is realized by signal lines to the reset terminals. The synthesis circuit 10 comprises a logical OR circuit, and synthesizes the sub-counter output signals SR1, SR2 to generate the trigger signal TRG.

Figure 3:
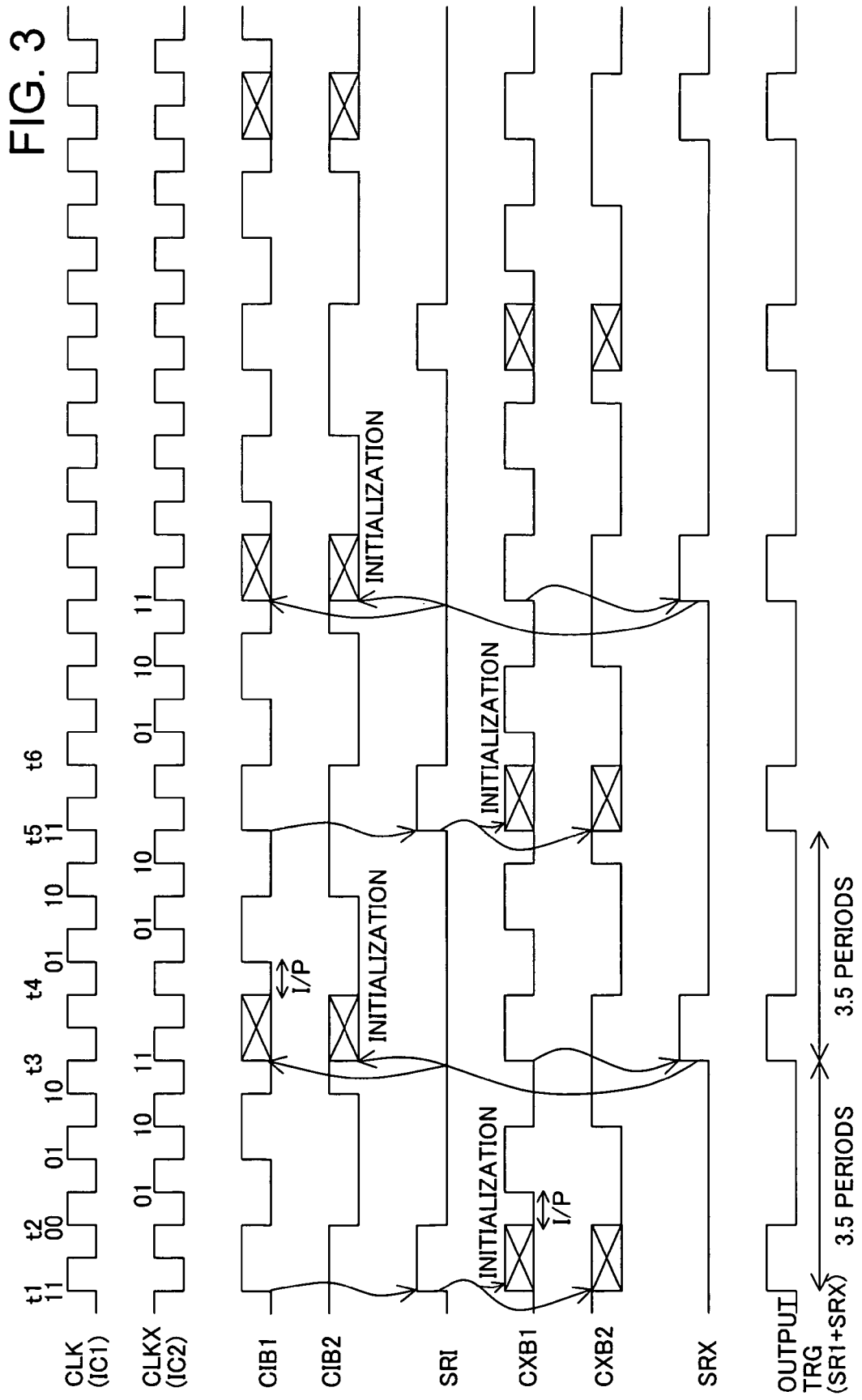
FIG. 3 is a diagram of the operation waveforms of the clock frequency divider of FIG. 2.

FIG. 3 is a diagram of the operation waveforms of the clock frequency divider of FIG. 2. The sub-clock signals CLK, CLKX are shifted by one-half of the reference clock period (180°), and so are opposite in phase. First, at time t1 the sub-counter SC1 ends counting and the sub-counter output signal SRI goes to H level, and in response, the sub-counter SC2 is reset to the initial value "00". This reset state continues until time t2, at which the count value "11" of the sub-counter SCI ends. When the reset state is cancelled at time t2, the sub-counter SC2 starts counting up in response to the next rising edge of the sub-clock signal CLKX. After the initialized state is cancelled at time t2, the rising edge of the first sub-clock pulse CLKX occurs ½ period later, and at that time the sub-counter SC2 counts up to "01". On the other hand, the count value of the sub-counter SC1 becomes "00" at time t2, and the sub-counter begins counting up in response to the next rising edge of the sub-clock signal CLK. That is, the sub-counter SC2 begins counting first, and one half-period later, the sub-counter SC1 begins counting.

The sub-counter SC2 counts the sub-clock CLKX rising edges, in sequence, "01", "10", "11", and at time t3 the counting-end judgment circuit END2 detects the ending count "11" and sets the sub-counter output signal SRX to H level. At this time, the sub-counter SC1 has not yet ended counting. In response to the sub-counter output signal SR2, the sub-counter SC1 is reset to the initial value "00". This reset state continues until time t4. After time t4, the sub-counter SC1 begins counting the rising edges of the sub-clock signal CLK. At this time also, one half-period after the initialized state is cancelled at time t4, the first sub-clock CLK rising edge occurs, and the sub-counter SC1 counts up to "01". The sub-counter SC2 begins counting up one-half period later than the sub-counter SC1. Hence this time, the sub-counter SC1 ends counting up to "11" and sets the sub-counter output signal SRI to H level, to initialize the other sub-counter SC2.

In this way, the two sub-counters SC1, SC2 repeat operations in alternation (or in order) in which they are initialized, count up, and end counting. Further, each sub-counter is synchronized with its own sub-clock signal to perform count-up operations, so that the time from initialization (times t1, t3) until the end of counting (times t2, t5) are 3.5 (M+1/P) times the reference clock period. That is, the sub-counter output signals SRI, SRX are generated in alternation every 3.5 clock periods, and the interval is the same 3.5 periods.

The synthesis circuit 10, which performs logical OR operations, synthesizes these sub-counter output signals SRI, SRX, to generate a trigger signal TRG which frequency-divides the reference clock signal by 3.5. This trigger signal TRG is for example frequency-divided by 2 by the frequency divider 200, to generate a frequency-divided clock signal DCLK divided by 7. If frequency-divided by 4, a frequency-divided clock signal DCLK divided by 14 is generated. That is, the trigger signal generation circuit 100 can generate a trigger signal TRG to in turn generate a frequency-divided clock signal frequency-divided by 7, by providing in parallel two sets of only two counter stages capable of counting up to 3, without the need for a counter with a many-stage configuration capable of counting up to 7 clock pulses. Further, the frequency-divided clock signal DCLK has a duty ratio of 50%.

Figure 4:
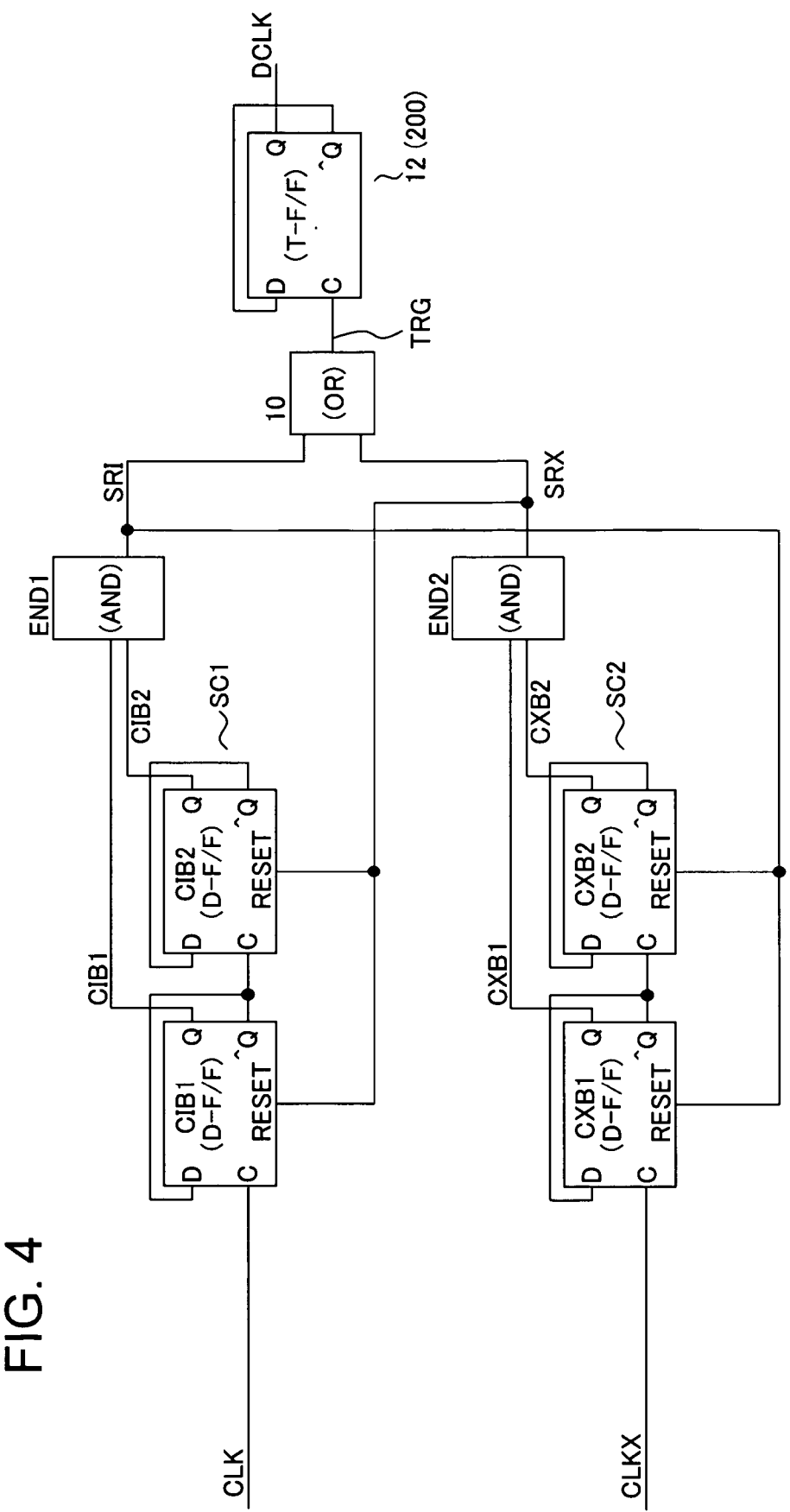
FIG. 4 is the circuit diagram of the clock frequency divider of FIG. 2.

FIG. 4 is the circuit diagram of the clock frequency divider of FIG. 2. In FIG. 4, the frequency divider is a divide-by-2 frequency divider circuit comprising a single flip-flop 12.

Figure 5:
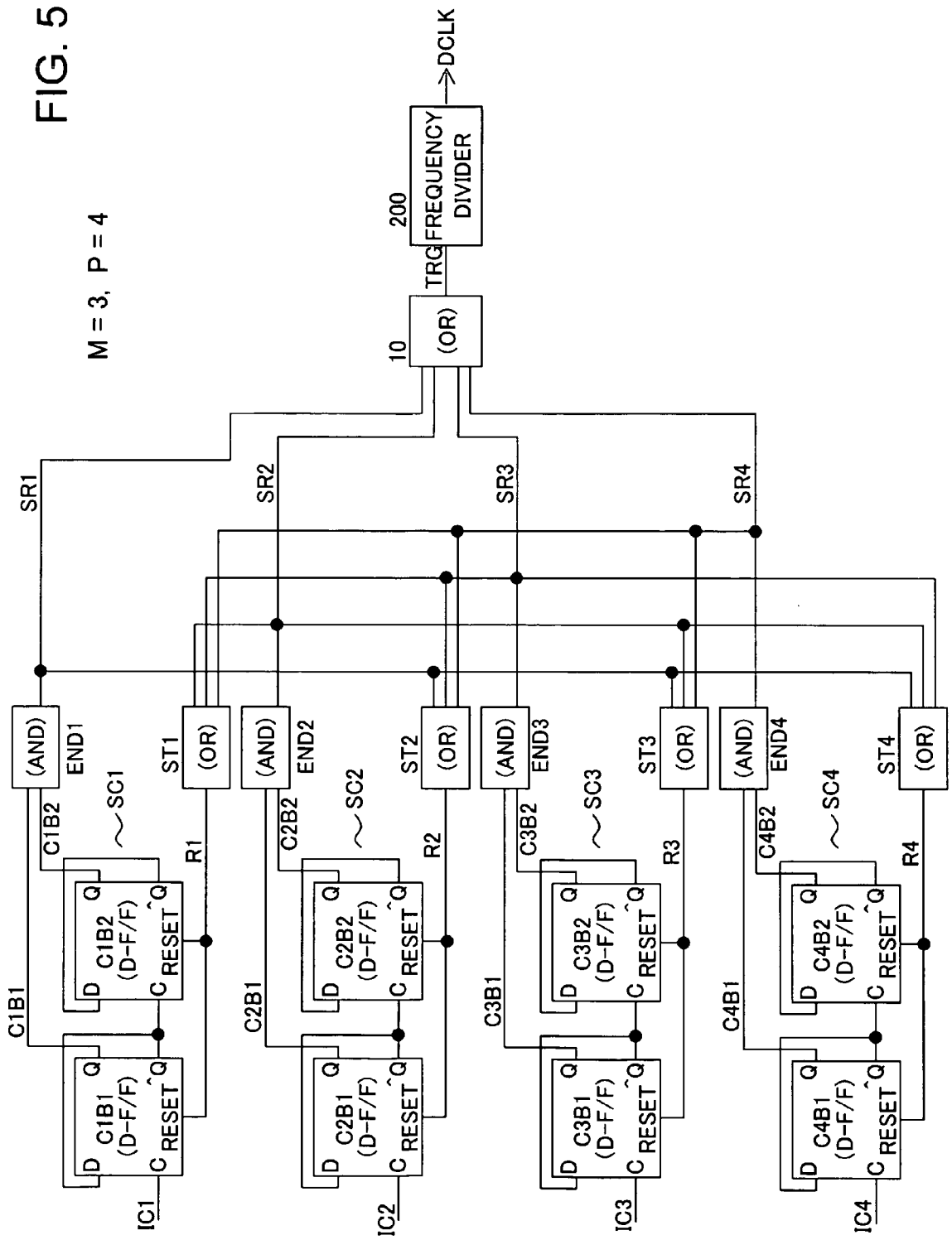
FIG. 5 is a specific circuit diagram of a clock frequency divider in the first embodiment.
Figure 6:
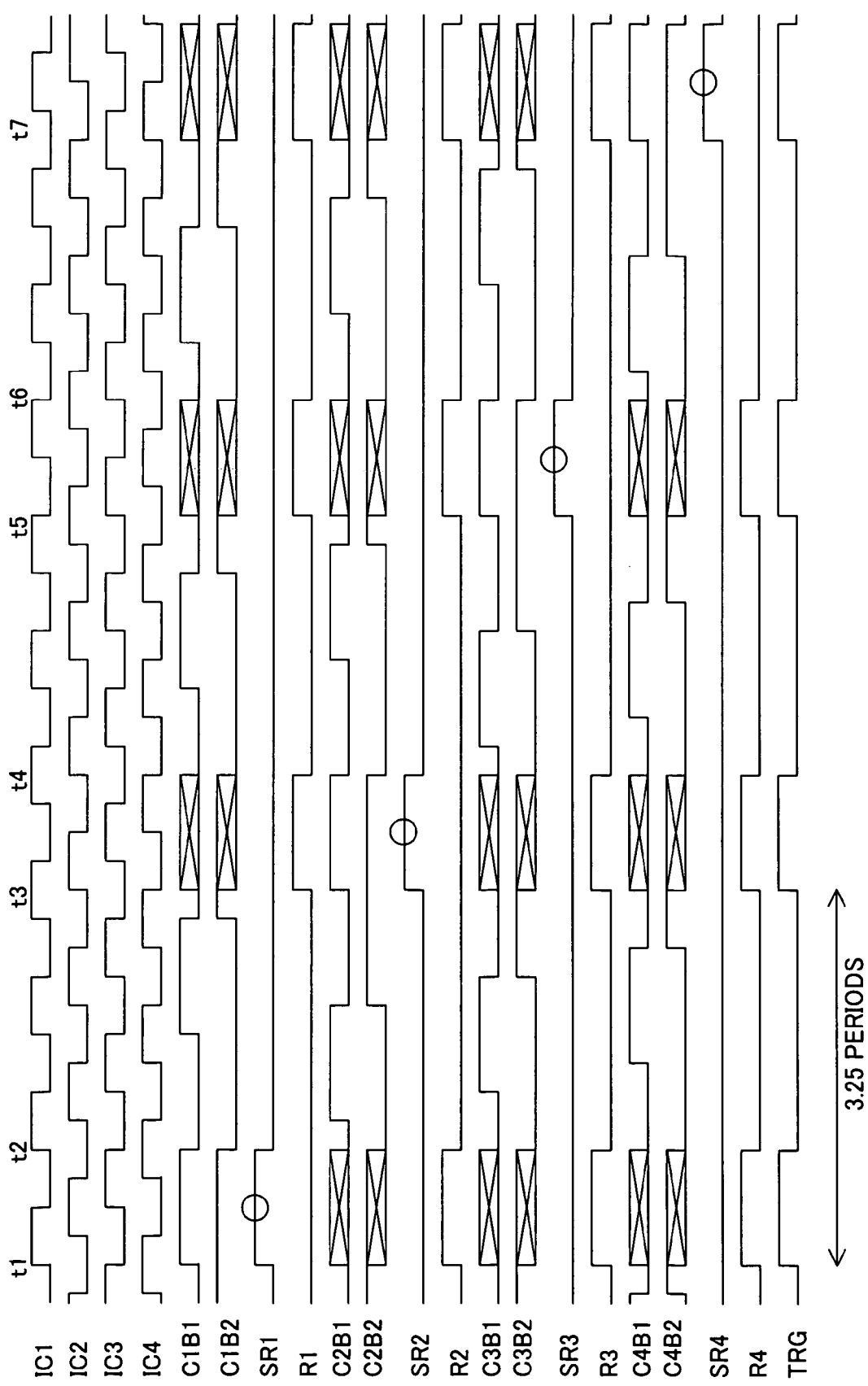
FIG. 6 is a diagram of the operation waveforms of the clock frequency divider of FIG. 5.

FIG. 5 is a specific circuit diagram of the clock frequency divider in the first embodiment. FIG. 6 is a diagram of the operation waveforms. This clock frequency divider corresponds to the case M=3, P=4 in FIG. 1. That is, the clock frequency divider comprises four sub-counters SC1 to SC4 in parallel, and each sub-counter is supplied with a sub-clock signal IC1 to IC4 shifted in sequence by ¼ period of the reference clock signal. Each of the sub-counters SC1 to SC4 has a counting-end judgment circuit END1 to END4, which when the sub-counter counts to M=3 (count value "11") judges that counting has ended and generates sub-counter output signals SR1 to SR4, and an initialization control circuit ST1 to ST4 which, in response to a sub-counter output signal from any of the other sub-counters, initializes the count value to "00". Otherwise the configuration is the same as in FIG. 2.

As shown in the waveform diagrams of FIG. 6, at time t1 the count value of the sub-counter SC1 becomes "11" and the counting-end judgment circuit END1 sets the sub-counter output signal SR1 to H level. In the diagram, this is indicated by a circle symbol. In response, All of the other sub-counters SC2 to SC4 are initialized to the initial value "00". After time t2 at which the initialized state is cancelled, the next-stage sub-counter SC2 first responds to the rising edge of the sub-clock signal IC2 and begins counting. That is, when ¼ period has elapsed after time t2, the rising edge of sub-clock signal IC2 is first counted.

When at time t3 the count value of sub-counter SC2 becomes "11", the counting-end judgment circuit END2 sets the sub-counter output signal SR2 to H level. In the diagram, this is indicated by a circle symbol. In response, the other sub-counters SC1, SC3, SC4 are reset to the initial value "00". Then, this time, the sub-counter SC3 first begins counting, ¼-period after time t4, in response to the rising edge of the sub-clock signal IC3. When the sub-counter SC3 ends counting, this time, the sub-counter SC4 first begins counting.

In this way, the four sub-counters SC1 to SC4 end counting in sequence, and generate sub-counter output signals SR1 to SR4 (circle symbols in the drawing) every (3+1/4) period. Hence, the synthesis circuit 10, by synthesizing these sub-counter output signals SR1 to SR4, generates the trigger signal TRG having a period equal to 3.25 times the reference clock period. And by frequency-dividing by 4 this trigger signal TRG, the frequency divider 200 generates the frequency-divided clock signal DCLK which frequency-divides the reference clock signal by 13 (3.25×4).

As described above, the trigger signal generation circuit of the clock frequency divider shown in FIG. 1, by causing P sub-counters to each count to M, can generate the trigger signal having a period (M+1/P) times the reference clock period. Hence by employing a design in which M and P are arbitrary numbers, the frequency-divided clock signal can be generated, with frequency divided by the arbitrary odd number, with the duty ratio of 50%. Further, by increasing the number of sub-counters P the number of stages in each sub-counter can be reduced, and the counter with a small number of stages can operate with a fast reference clock, so that the clock frequency divider accommodating a fast clock signal can be realized. In the most representative example, when generating the frequency-divided clock signal which divides the reference clock frequency by L, P sub-counters capable of counting to (L−1)/P=M are provided in parallel. Here it is desirable that one of a sub-multiple of (L−1) be selected as P, and that M be selected to be 1, 3, 7, 15, or another number close to $2^n-1$, to make effective use of sub-counters.

Figure 7:
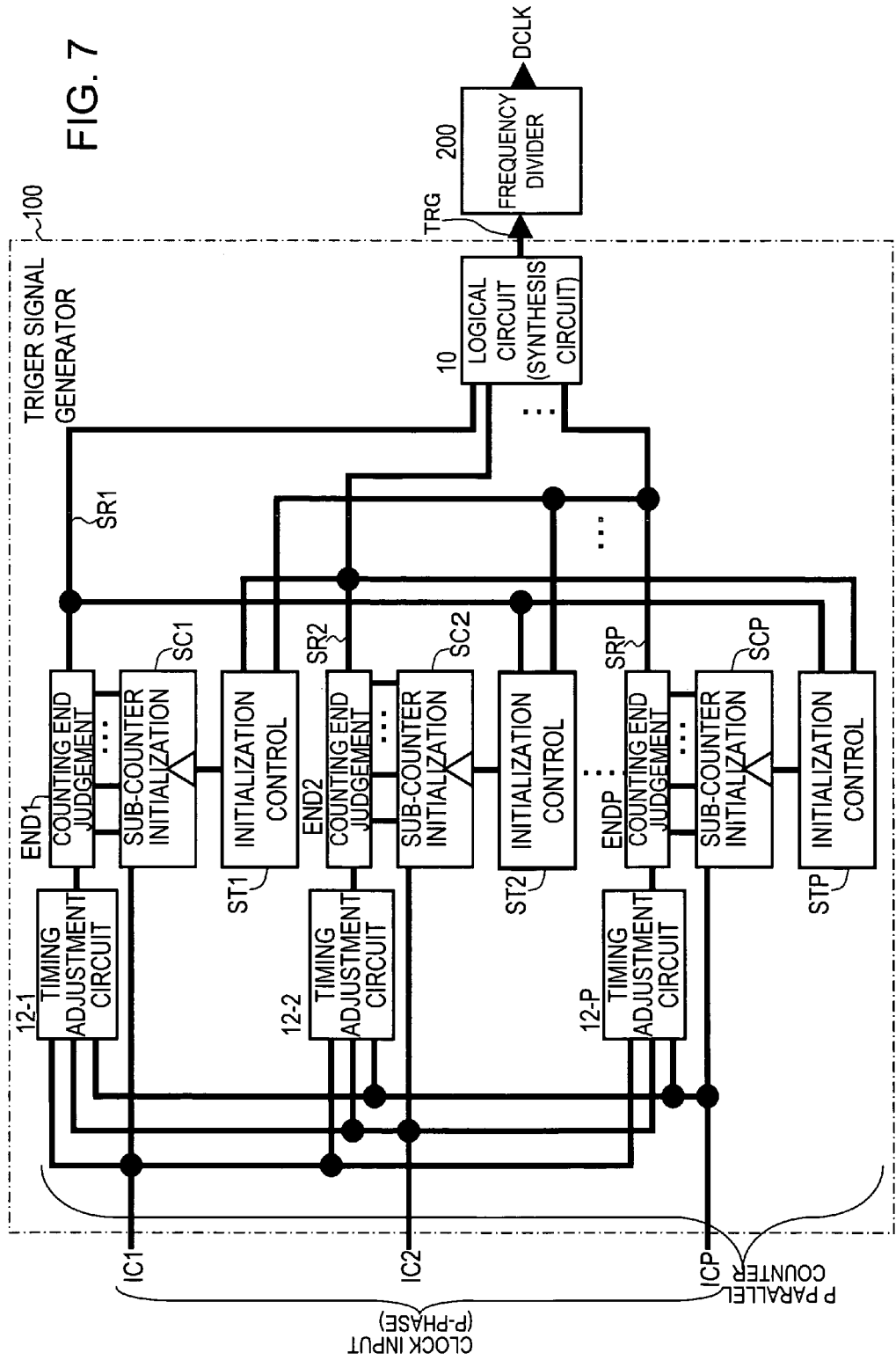
FIG. 7 shows the configuration of a clock frequency divider in a second embodiment.

FIG. 7 shows the configuration of a clock frequency divider in a second embodiment. Component elements which are the same as in FIG. 1 are assigned the same reference numbers. This clock frequency divider has, in the trigger generation circuit 100, timing adjustment circuits 12-1 to 12-P to adjust the pulse widths of the sub-counter output signals SRI, SRX. According to the timing chart of FIG. 3, counting is begun 1/P period after each of the sub-counters SC1, SC2 is reset. However, if the clock signal is fast, and the number of sub-counters P is large, the duration of 1/P period is short, and there is the possibility of erroneous operation. Hence in this clock frequency divider, timing adjustment circuits 12-1 to 12-P are provided to generate gate signals with appropriate pulse widths based on the sub-clock signals IC1 to ICP. The counting-end judgment circuits END1 to ENDP generate sub-clock output signals SR1 to SRP with pulse widths according to the gate signals generated by the timing adjustment circuits. By this means, the interval from the time the next-stage sub-counter reset state is cancelled until the first clock pulse is counted can be made sufficiently longer than 1/P.

Figure 8:
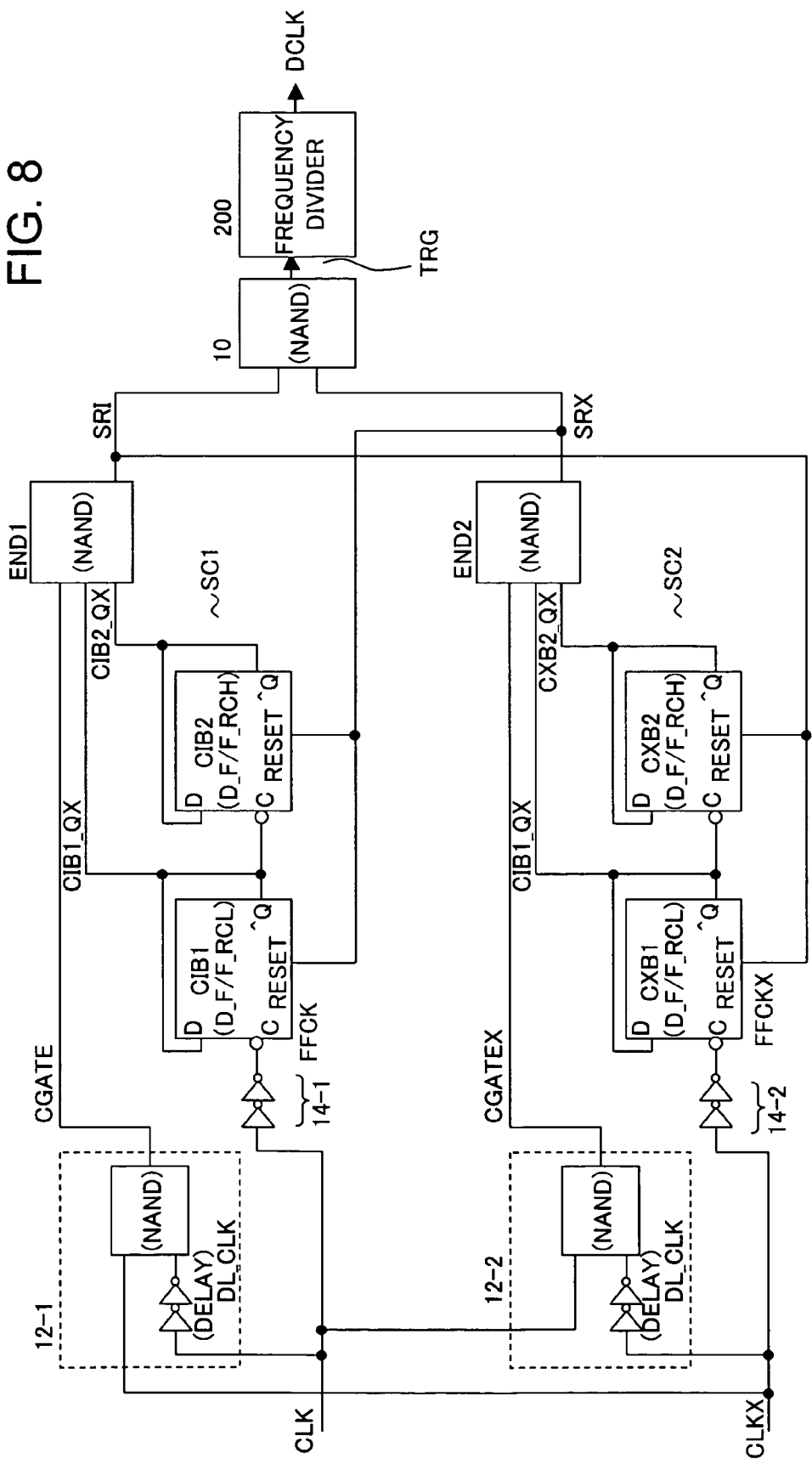
FIG. 8 is a specific circuit diagram of the clock frequency divider of FIG. 7.
Figure 9:
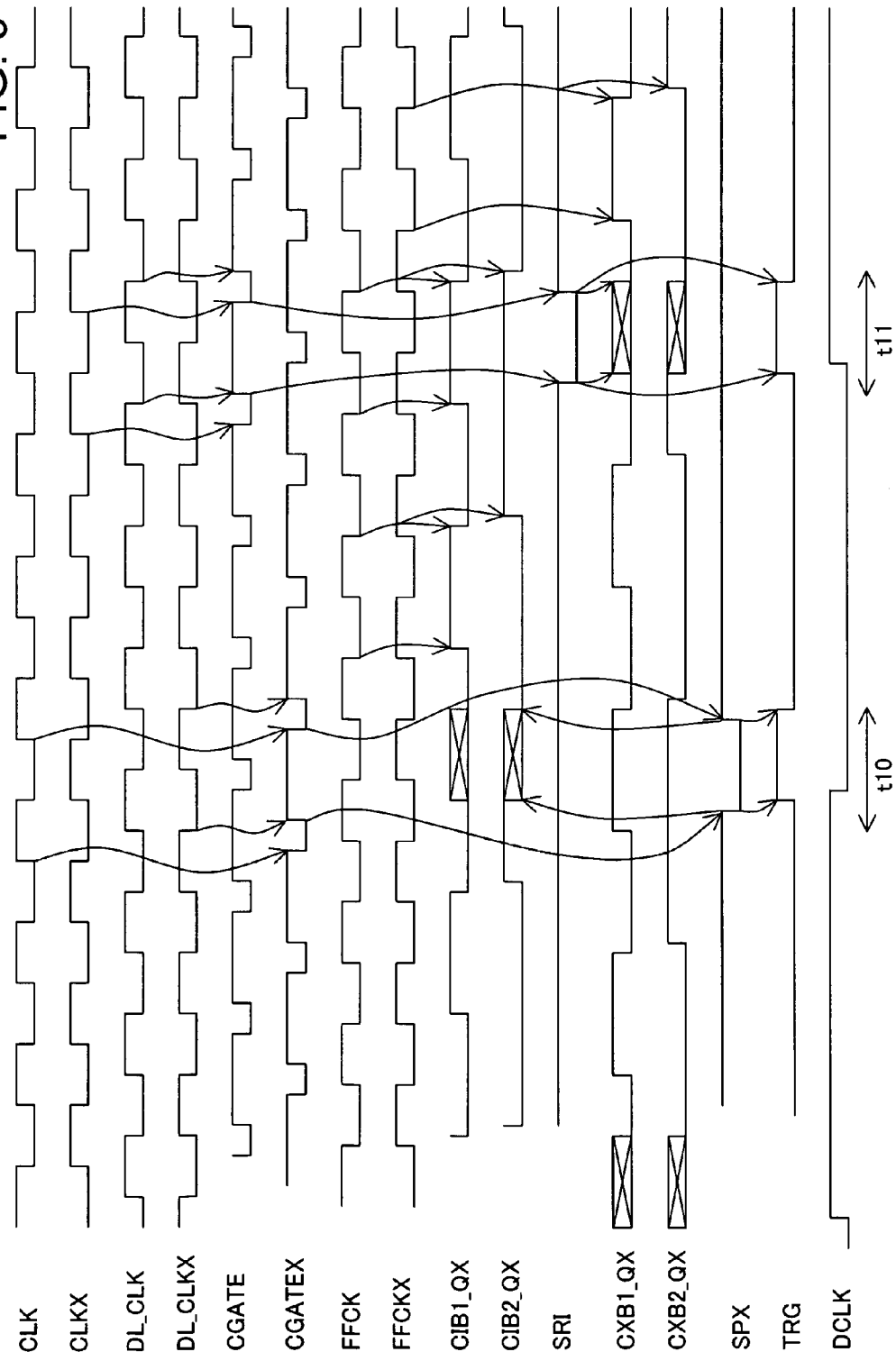
FIG. 9 is a diagram of the operation waveforms of the clock frequency divider of FIG. 8.

FIG. 8 is a specific circuit diagram of the clock frequency divider of FIG. 7. FIG. 9 is a diagram of the operation waveforms. This clock frequency divider differs from the circuit of FIG. 2 in that timing adjustment circuits 12-1, 12-2 are provided; in that delay circuits 14-1, 14-2 are provided to delay the sub-clock signals CLK, CLKX supplied to the sub-counters SC1, SC2; in that the clock inputs to the sub-counters SC1, SC2 use inverted logic; in that, accompanying this, the counting-end judgment circuits END1, END2 comprise NAND circuits, and the inverted output ^Q is supplied to the counter; and in that, as a consequence, the sub-counter output signals SRI, SRX enter the active state at the L level, so that the synthesis circuit 10 comprises NAND circuits. However, functions other than the provision of the timing adjustment circuits are the same as for the circuits of FIG. 2.

As shown by the waveform diagram of FIG. 9, in the interval t10 the gate signal CGATEX is generated by the timing adjustment circuit 12-2 from the sub-clock signal CLK and from the clock signal DL_CLKX resulting from delaying the sub-clock signal CLKX. When this gate signal CGATEX and the count values CXB1_QX and CXB2_QX of the sub-counter SC2 are all at H level, an L-level sub-counter output signal SRX is generated. The pulse width of this sub-counter output signal SRX id adjusted by the gate width of the gate signal CGATEX. While this sub-counter output signal SRX is at L level, the flip-flop of the sub-counter SC1 enters the reset state. After the reset state is cancelled, in response to falling of the clock signal FFCK to L level, the sub-counter SC1 begins counting. In the interval t11 also, operations similar to those described above are performed, to initialize the sub-counter SC2 and begin counting.

Thus by means of the timing adjustment circuits 12-1, 12-2, a gate signal is generated and the pulse widths of the sub-counter output signals SRI, SRX are adjusted, so that a sufficient time interval can be secured from initialization until the beginning of counting.

Figure 10:
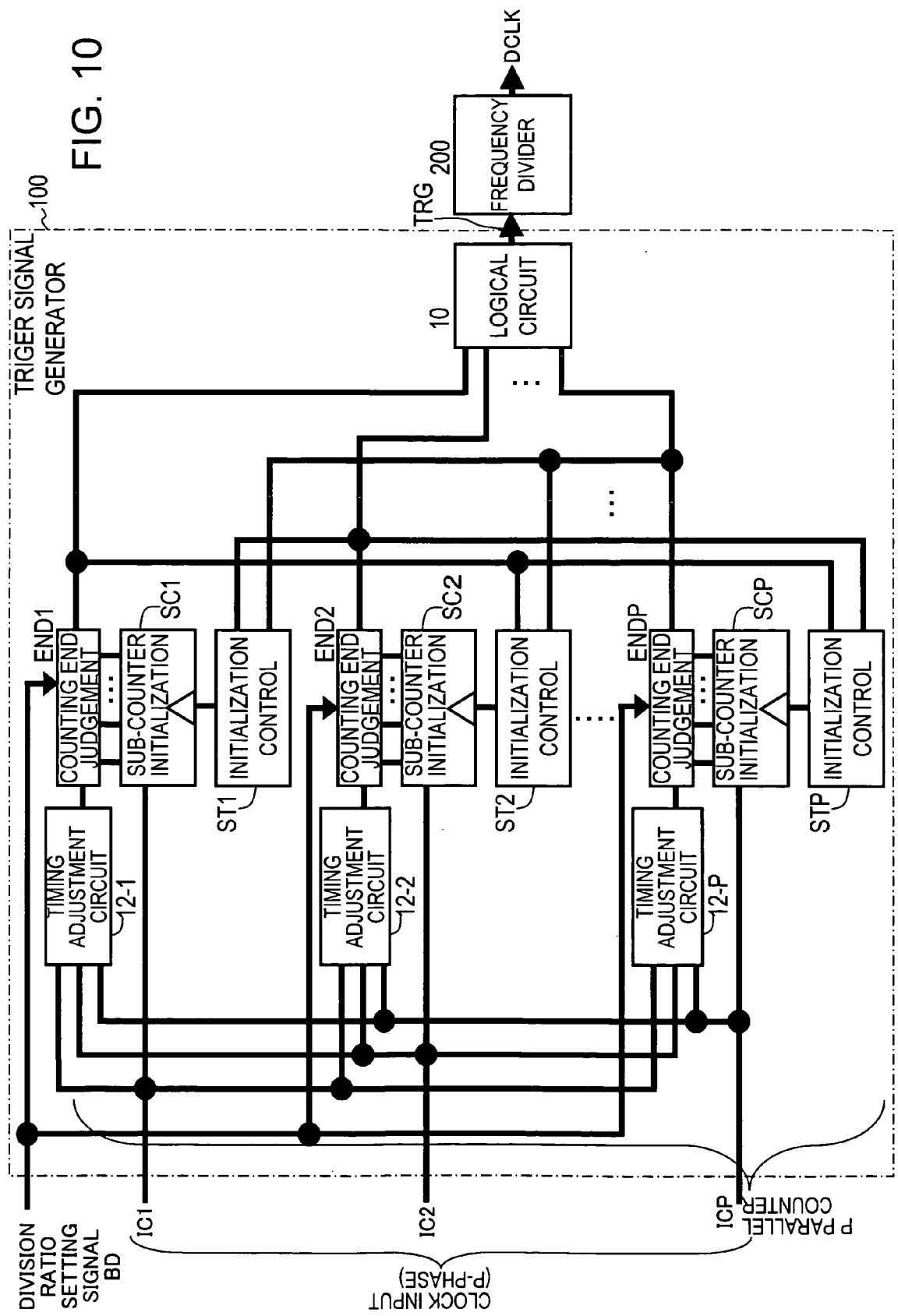
FIG. 10 shows the configuration of a clock frequency divider in a third embodiment.

FIG. 10 shows the configuration of a clock frequency divider in a third embodiment. In the trigger signal generation circuit 100 of the clock frequency divider described in the first and second embodiments, the number of sub-counters P is fixed, and the count value M at the end of counting as judged by the counting-end judgment circuits is fixed. In the third embodiment, a division ratio setting signal BD is supplied to the counting-end judgment circuits END1 to ENDP, so that the counting-end value M of each sub-counter can be changed. By this means, each sub-counter is reset to a prescribed initial value by an initialization control circuit, and subsequently, upon counting up to the final count value set by the division ratio setting signal BD, the counting-end judgment circuits END1 to ENDP judge that counting has ended, and the sub-counter output signals SR1 to SRP are generated. This method of variable setting of the counting-end value of the counting-end judgment circuits by the division ratio setting signal BD is advantageous when each sub-counter is initialized to the count value "0" by the initialization control circuit.

Conversely, when a counting-end judgment circuit takes the maximum count value of the sub-counter to be the counting-end value, a method in which the division ratio setting signal BD variably sets the initialization control circuits ST1 to STP is advantageous. Or, both the initialization control circuits and counting-end judgment circuits can be variably set by the division ratio setting signal BD. In either case, by variably setting each of the sub-counter count values M, the value of (M+1/P) which is the period of the sub-counter output signals SR1 to SRP can be variably set, and so the division ratio of the frequency-divided clock signal can be changed to an arbitrary value.

FIG. 11 is a specific circuit diagram of a clock frequency divider of the third embodiment. Compared with the clock frequency divider of FIG. 2, this clock frequency divider differs in that the sub-counters SC1 and SC2 comprise three flip-flop stages, and in that timing adjustment circuits 12-1, 12-2 are provided. In contrast with FIG. 8, these timing adjustment circuits 12-1, 12-2 respectively generate gate signals CGATE, CGATEX by taking the logical OR of the respective sub-clock signals CLK, CLKX with the delaying signal. Hence no circuit to delay sub-clock signals is provided.

In the specific example of FIG. 11, the three bits of the division ratio setting signals BD1 to BD3 are supplied to the initialization control circuits ST1, ST2. The initialization control circuit ST1 comprises three flip-flops, and the division ratio setting signals BD1 to BD3 are input as data signals to the respective flip-flops in response to another sub-counter output signal SRX, so that each of the flip-flops of the sub-counter SC1 is initialized to an initial value according to the division ratio setting signals BD1 to BD3. In the example of FIG. 11, the division ratio setting signals BD1 to BD3 are "100", so that the initialization control circuit ST1 sets the initial count value of the sub-counter SC1 to "100" in accordance with the value of "100". When the counting-end judgment circuit END1 detects the maximum count value "111" of the sub-counter SC1, the sub-counter output signal SR1 is generated, and so the sub-counter SC1, upon counting three clock CLK pulses after initialization, judges that counting has ended. The initialization control circuit ST2 and sub-counter SC2 also perform the same operation.

In this way, by setting the initialization count value to an arbitrary value, the number of counts of sub-counters M can be changed to an arbitrary value. Together with this, the division ratio can be set to an arbitrary value. However, due to demands for high-speed operation, it is desirable that the count value M be a value as close as possible to the maximum value which can be counted by the sub-counters. For example, if sub-counters are three bits, the count value M can be any among "7", "6", "5" and "4", and if the sub-counters are two bits, it is desirable that the count value be either "3" or "2".

In FIG. 11, when the counting-end judgment circuits END1, END2 are set by the division ratio setting signals BD, the count value of the sub-counters are decoded and may be converted so as to be the maximum count value for a desired count value M.

FIG. 12 and FIG. 13 show the configurations of clock frequency dividers in a fourth embodiment. FIG. 14 is a diagram of the operation waveforms. When the clock frequency divider is configured as an LSI, scattering in the transistor threshold values and other characteristics is unavoidable. Such transistor characteristic scattering is accompanied by slight differences in the judgment timing of the counting-end judgment circuits of the sub-counters. As a result, as indicated in FIG. 14(A), deviations occur in the timing of the different sub-counter output signals SR1 to SR4. Consequently, even if the periods of the sub-counter output signals SR1 to SR4 are constant, the period of the trigger signal TRG synthesized from these includes scattering. Hence in this fourth embodiment, variable delay devices 16-1 to 16-P are provided in order to calibrate the shifts in timing among these sub-counter output signals.

In the example of FIG. 12, variable delay devices 16-1 to 16-P are provided for the sub-clock signals IC1 to ICP, and by means of the delay adjustment signal DC, the delay amounts of these variable delay devices can be adjusted. In the example of FIG. 13, variable delay devices 16-1 to 16-P are provided for the sub-counter output signals SR1 to SRP, and by means of the delay adjustment signal DC, the delay amounts of these variable delay devices can be adjusted.

As shown in FIG. 14(B), by adjusting delays it is possible to perform fine adjustment of the timing of the sub-counter output signals SR1 to SR4, so that the period of the trigger signal TRG can be made constant.

Figure 15:
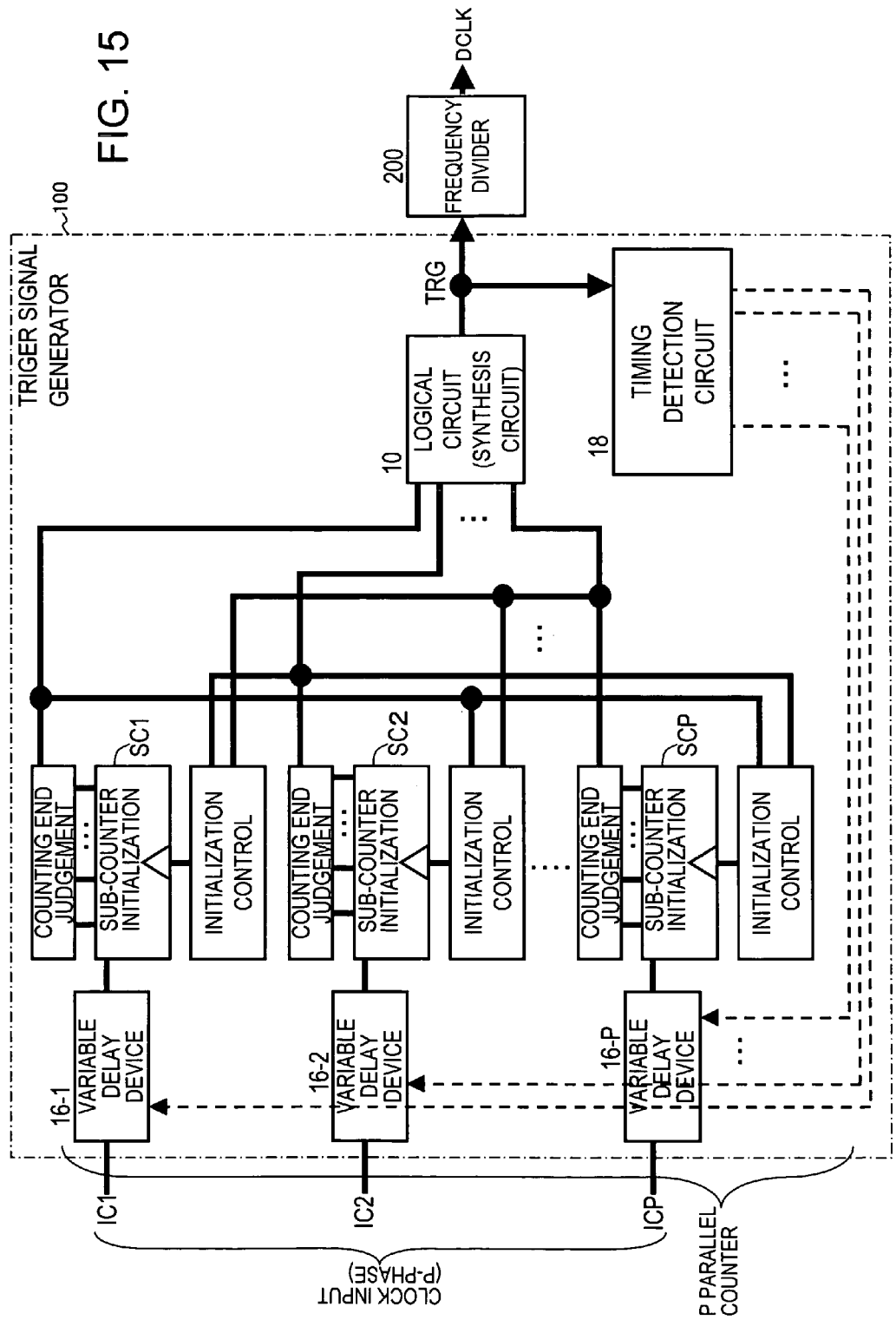
FIG. 15 shows a modified example of the fourth embodiment.

FIG. 15 shows a modified example of the fourth embodiment. In this modified example, the delay amounts of the variable delay devices 16-1 to 16-P can be automatically adjusted by a timing detection circuit 18 which detects the timing of the trigger signal of the synthesis circuit 10.

Figure 16:
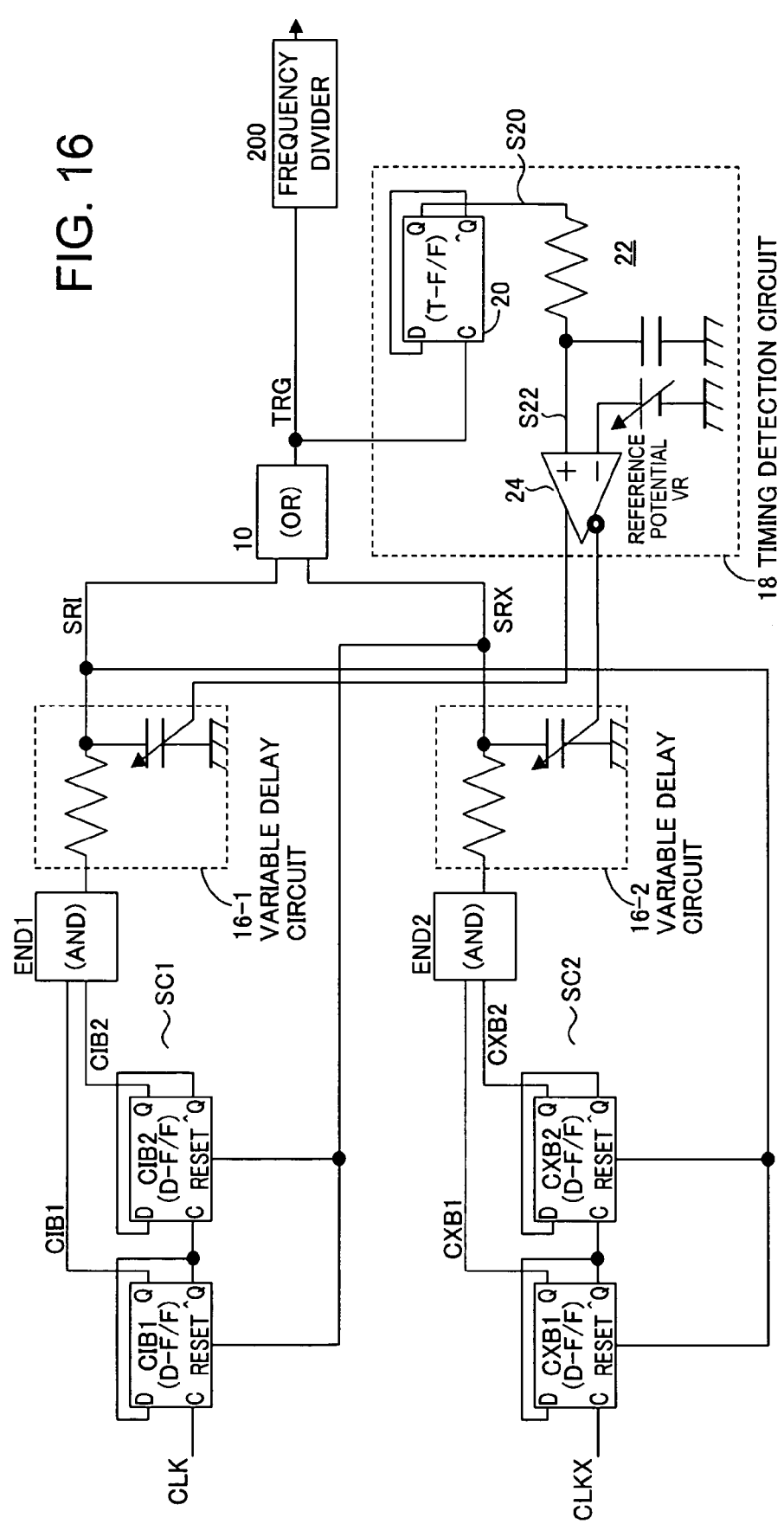
FIG. 16 is a diagram of the operation waveforms for FIG. 15.

FIG. 16 is a specific circuit diagram of FIG. 15. In this specific circuit, in contrast with FIG. 15, the variable delay circuit 16-1, 16-2 cause delays in the sub-counter output signals SRI, SRX. That is, the variable delay circuitry is the same as in FIG. 13. The divide-by-two frequency divider circuit 20 of the timing detection circuit 18 divides by two the frequency of the trigger signal TRG of the synthesis circuit 10. As a result, the output S20 of the divide-by-two circuit 20 is a clock signal which rises in response to the sub-counter output signal SRI and falls in response to the sub-counter output signal SRX. This clock signal S20 is converted into a sawtooth waveform S22 by a low-pass filter circuit 22 comprising a resistance and a capacitor, and is compared with the reference potential VR by the comparator 24. When the sub-counter output signal SRI lags, the sawtooth waveform S22 shifts to a higher potential, and in response the non-inverted output of the comparator 24 rises. This non-inverted output reduces the delay amount of the variable delay circuit 16-1, to correct the delay of the sub-counter output signal SRI. On the other hand, when the sub-counter output signal SRX lags, the sawtooth waveform S22 shifts to a lower potential, and as a result the inverted output of the comparator 24 rises. This inverted output reduces the delay amount of the variable delay circuit 16-2, so that the delay of the sub-counter output signal SRX is corrected.

In this way, shifts in the timing of the trigger signal TRG are detected, and the delay amounts of the sub-counter output signals SRI, SRX are automatically corrected in response to these shifts. As a result, the pulse interval of the trigger signal TRG is adjusted so as to be constant.

Figure 17:
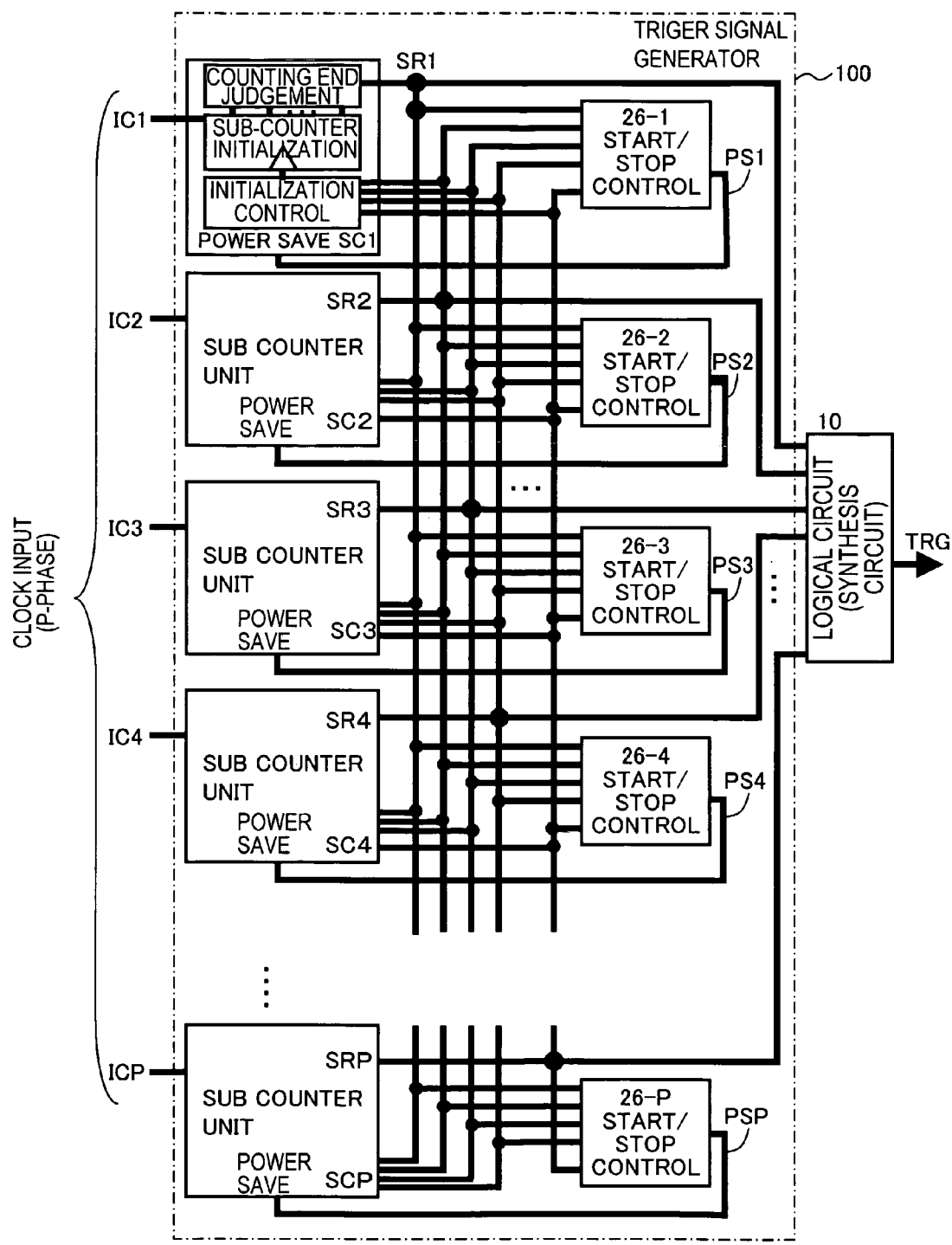
FIG. 17 shows the configuration of the trigger generation circuit of a clock frequency divider in a fifth embodiment.

FIG. 17 shows the configuration of the trigger generation circuit of a clock frequency divider in a fifth embodiment. The frequency divider 200 of the clock frequency divider is omitted. This trigger generation circuit 100 has, for each sub-counter (where, in the drawing, a sub-counter, an initialization control circuit, and a counting-end judgment circuit are together taken to be a sub-counter unit), a start/stop control circuit 26-1 to 26-P which controls operation starting and stopping. The start/stop control circuits 26-1 to 26-P all take as inputs the sub-counter output signals SR1 to SRP respectively, to start the sub-counter unit only over necessary intervals, and to stop operation over unnecessary intervals.

In the trigger generation circuits of the embodiment of FIG. 1 through FIG. 4, all the sub-counters are operating simultaneously; but of the P sub-counters, only the output of the single sub-counter which begins counting first is made valid. Hence operation of the sub-counter the output of which is made valid is necessary, but operation of the other sub-counters is unnecessary. Thus the start/stop control circuits 26-1 through 26-P monitor the other sub-counter output signals, detect intervals in which operation is necessary, and during such intervals only employ power-saving signals PS1 to PSP to start the corresponding sub-counter unit. During other intervals, operation of the sub-counter unit is stopped as necessary.

Figure 18:
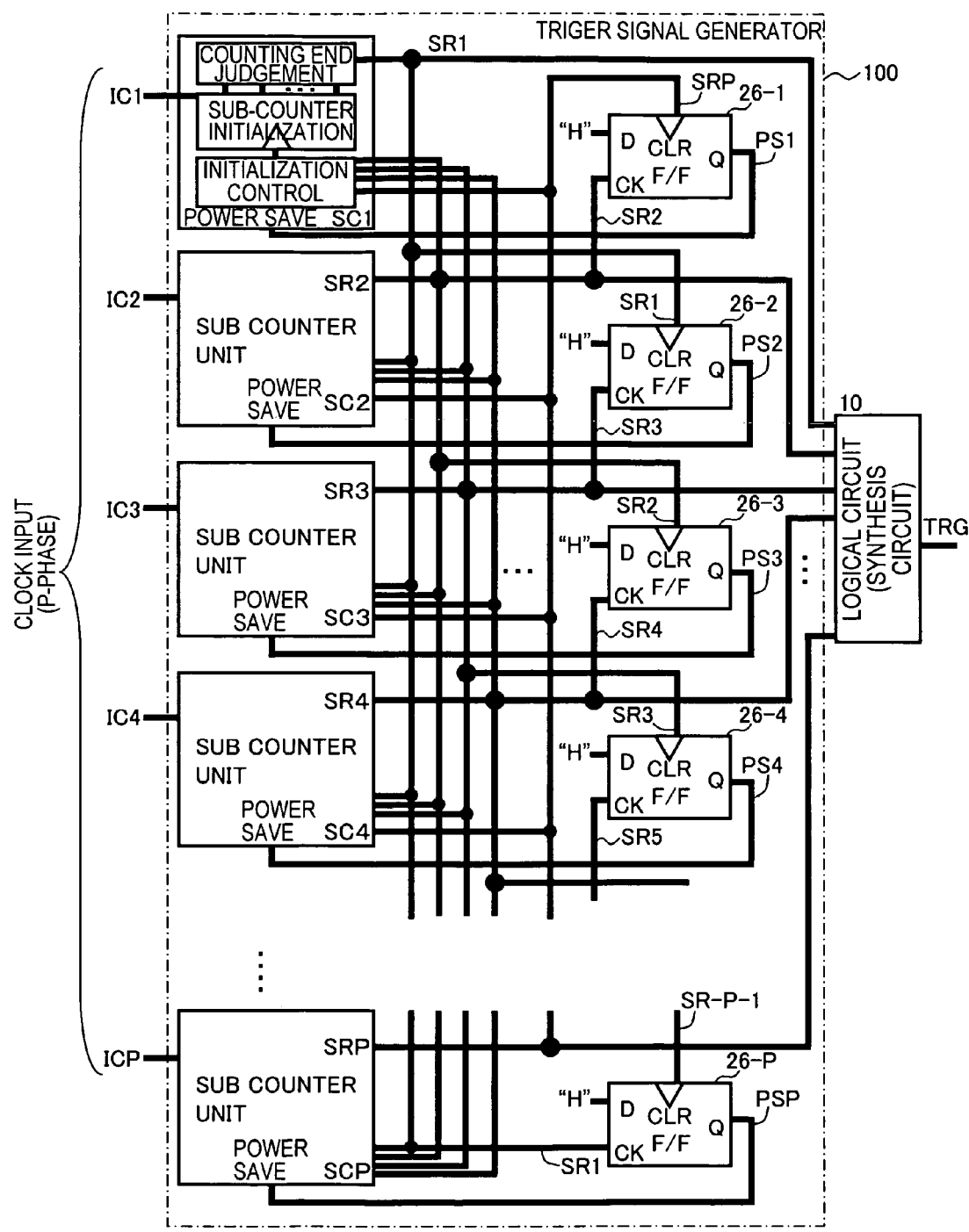
FIG. 18 is a specific circuit diagram for FIG. 17.
Figure 19:
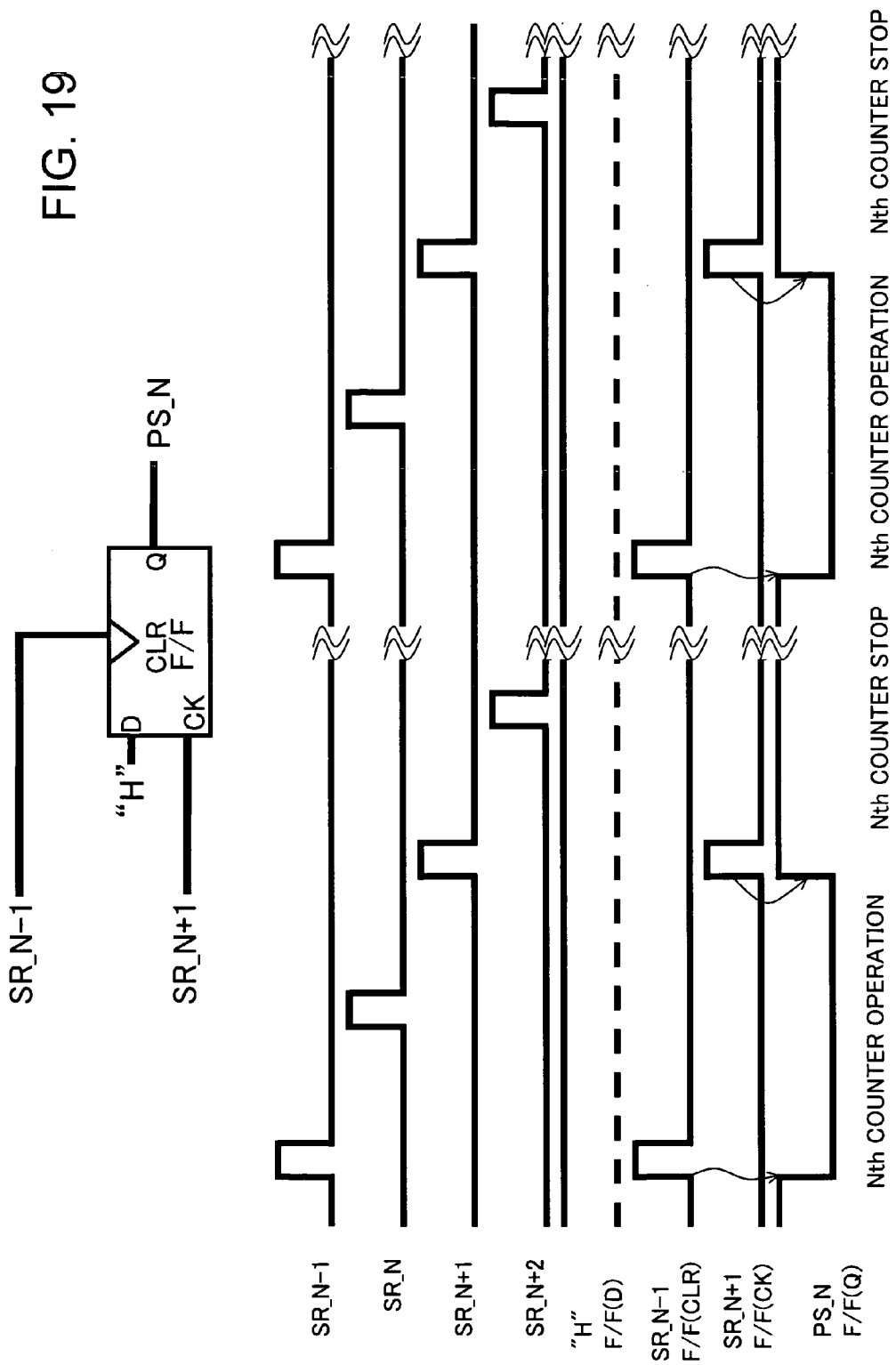
FIG. 19 is a diagram of the operation waveforms for FIG. 18.

FIG. 18 is a specific circuit diagram for FIG. 17. FIG. 19 is a diagram of the operation waveforms. In the specific example of FIG. 18, the start/stop control circuits 26-1 to 26-P comprise flip-flops. In the case of the start/stop control circuit 26-1, the data input terminal D of the flip-flop is connected to H level, the previous stage sub-counter output signal SRP is supplied to the clear input terminal, and the next-stage sub-counter output signal SR2 is supplied to the clock input terminal. In the cases of the other start/stop control circuits 26-N (where N is from 1 to P), as shown in FIG. 19, the previous-stage sub-counter output signal SR_N−1 is supplied to the clear input terminal, and the next-stage sub-counter output signal SR_N+1 is supplied to the clock input terminal.

As shown in FIG. 19, in this operation when the previous-stage sub-counter output signal SR_N−1 is supplied the flip-flop is cleared, the power-saving signal PS_N is set to L level, and the corresponding sub-counter unit power-saving mode is cancelled. As a result, operation of the sub-counter unit is started. When this sub-counter unit ends counting, its own sub-counter output signal SR_N is output. At this point, operation of the sub-counter unit can be stopped; but in order to prevent erroneous operation due to timing shifts and similar, the flip-flop captures H level data input in response to the next-stage sub-counter output signal SR_N+1, the power-saving signal PS_N is set to H level, and the corresponding sub-counter unit is put into power-saving mode. After this point, the operation of the sub-counter unit is stopped, so that wasteful power consumption is avoided.

Thus according to the fifth embodiment, each of the sub-counter units begins operation in response to the previous-stage sub-counter output signal, and after generating a valid sub-counter output, stops operation in response to the next-stage sub-counter output signal. The timing to start operation and the timing to stop operation can be freely selected according to the circuit configuration; operation may be started by the sub-counter output signal from the stage preceding the previous stage, and operation may be stopped in response to the sub-counter unit's own sub-counter output signal. Thus among P sub-counters, only the necessary sub-counters are made to operate in sequence, so that power consumption can be reduced.

In the trigger signal generation circuit of the fifth embodiment, only the necessary sub-counter units operate, and so it is for example sufficient for each sub-counter to initialize only the previous-stage and next-stage sub-counters using the sub-counter output signal generated when counting of M pulses has ended. Further, when the previous-stage sub-counter operation is already stopped, it is sufficient to initialize, at least, only the next-stage sub-counter. That is, it is sufficient to initialize only other sub-counters which are currently operating. To this extent, the power consumption accompanying initialization can be reduced.

FIG. 20 shows an example of application of the trigger signal generation circuit in a sixth embodiment. This trigger signal generation circuit 100 is the circuit example of FIG. 8, provided with variable delay circuits 16-1, 16-2. In the first through fifth embodiments, a trigger generation circuit is used in the clock frequency divider. However, the trigger generation circuit generates a trigger signal which frequency-divides the reference clock signal by (M+1/P), and so various applications are conceivable.

FIG. 20 is one example; in this example, the four-phase signal generator 400 uses a trigger signal TRG to generate four-phase signals I, IX, Q, QX. In a quadrature modulation circuit or quadrature demodulation circuit in communication circuitry, a four-phase clock signal with phases shifted 90° is necessary. In the example of FIG. 20, a four-phase clock signal is generated from a trigger signal TRG which frequency-divides a reference clock signal by (M+1/P). That is, a four-phase clock signal is generated in synchronization with the trigger signal TRG. Phase shifts in the four-phase clock signal are detected by a phase shift detection circuit 18A, and delay times of the variable delay circuits 16-1, 16-2 of the trigger signal generation circuit 100 are controlled.

The phase shift detection circuit 18A has a mixer 26 which mixes the four-phase clock signals I, IX, Q, QX; if the phases of the four-phase clock signal are shifted by exactly 90° each, the DC component output S26 of the mixer is at level "0", but if there is a shift from 90°, the level of the DC component output S26 of the mixer will be shifted to either the positive or to the negative side with a certain timing. This change is converted into a voltage by the low-pass filter 22 and is detected by the comparator 24, and the timing of the sub-counter output signals SRI, SRX in the trigger generation circuit 10 is adjusted. This delay adjustment operation is similar to that of the timing detection circuit of FIG. 16.

According to this embodiment, the trigger signal generation circuit 100 is provided with P sub-counters in parallel, and sub-clock signals IC1 to ICP each shifted by 1/P of the reference clock period are counted; by using the sub-counter output signal SR of the previous stage to initialize another sub-counter, the P sub-counters are made to perform counting operations and to perform counting-end operations in sequence, so that a trigger signal can be generated which fractionally divides the frequency of the reference clock signal. Even if the number of sub-counter stages is made as small as possible, a clock signal can be generated with a large division ratio.

What is claimed is:

1. A trigger signal generation circuit, which generates a trigger signal which frequency-divides a reference clock signal, comprising:
   first through Pth (where P is an integer) sub-counters, provided in parallel, which count clock pulses up to at least a prescribed number M+1 and provided in parallel; and,
   a synthesis circuit, which synthesizes first through Pth output signals generated when said sub-counters count to said number M and generate said trigger signal; and wherein said sub-counters are supplied with first through Pth clock signals respectively, the first through Pth clock signals having a same period as said reference clock and phases shifted in sequence by 1/P of said reference clock period;

an Nth (where N is an arbitrary number from 1 to P) sub-counter among said first through Pth sub-counters initializes at least said (N+1)th sub-counter excluding said Nth sub-counter, when said Nth sub-counter ends counting to said number M, and after said initialization, said (N+1)th sub-counter counts said number M pulses of the (N+1)th clock signal with phase lager by 1/P of the reference clock period than said Nth clock signal, and said (N+1)th sub-counter initializes the next-stage sub-counter when ends counting to said number M; and said trigger signal is generated upon each (M+1/P)th period of said reference clock signal.

2. The trigger signal generation circuit according to claim 1, wherein said sub-counters each includes a counting-end judgment circuit which judges the fact of having counted to said number M and generates said first through Pth output signals.

3. The trigger signal generation circuit according to claim 2, wherein said counting-end judgment circuits change said prescribed number M according to a division ratio setting signal.

4. The trigger signal generation circuit according to claim 1, wherein said sub-counters each includes an initialization circuit which sets an initial value in the sub-counter in response to the previous-stage sub-counter output signal.

5. The trigger signal generation circuit according to claim 4, wherein said initialization circuits change and set said initial value according to a division ratio setting signal.

6. The trigger signal generation circuit according to claim 2, wherein said counting-end judgment circuits judge the end of counting when said sub-counter counts a maximum count value.

7. The trigger signal generation circuit according to claim 4, wherein said initialization circuit sets said sub-counter to an initial value, during a interval in which said output signal of said sub-counter is at a first level, and further comprising a timing adjustment circuit which adjusts said length of said interval over which said output signal of said sub-counter is at said first level.

8. The trigger signal generation circuit according to claim 1, further comprising a variable delay circuit which individually adjusts timing of said sub-counter output signals.

9. The trigger signal generation circuit according to claim 8, further comprising a timing detection circuit which detects an edge timing of said trigger signal, and wherein said timing detection circuit adjusts a delay time of said variable delay circuit such that a period of said trigger signal is substantially constant in response to said edge timing detection.

10. The trigger signal generation circuit according to claim 1, further comprising a start/stop control circuit which sets the Nth (where N is from 1 to P) sub-counter among said P sub-counters to an operating state during a interval from said time of initialization by, at least, said output signal of the (N−1)th sub-counter, until said Nth sub-counter ends counting to said number M, and which sets said Nth sub-counter to a stopped state in other arbitrary intervals.

11. The trigger signal generation circuit according to claim 10, wherein said start/stop control circuit starts said Nth sub-counter in response to said output signal of said (N−1)th sub-counter, and stops said Nth sub-counter in response to said output signal of said (N+1)th sub-counter.

12. The trigger signal generation circuit according to claim 2, wherein said counting-end judgment circuits judge the end of counting when said sub-counter counts a maximum count value.

13. A clock frequency divider, comprising:
a trigger signal generation circuit according to any one of claims 1 through 10, and 12; and,
a frequency dividing circuit which divides said frequency of said trigger signal by a prescribed number, to generate a frequency-divided clock signal which frequency-divides said reference clock signal.

14. A clock signal generator, comprising:
a trigger signal generation circuit according to any one of claims 1 through 10, and 12; and,
a four-phase signal generator which sequentially generates a four-phase clock signal in synchronization with said trigger signal.

* * * * *